United States Patent [19]
Yamashita

[11] Patent Number: 5,483,559
[45] Date of Patent: Jan. 9, 1996

[54] PHASE-LOCKED LOOP DEVICE, OSCILLATOR, AND SIGNAL PROCESSOR

[75] Inventor: Hiromitsu Yamashita, Itami, Japan

[73] Assignee: Mitsubishi Denki Kabushiki Kaisha, Tokyo, Japan

[21] Appl. No.: 309,984

[22] Filed: Sep. 20, 1994

[30] Foreign Application Priority Data

Oct. 13, 1993 [JP] Japan ................................. 5-255699
Mar. 28, 1994 [JP] Japan ................................. 6-057357

[51] Int. Cl.$^6$ ..................................... H03D 3/24
[52] U.S. Cl. .................... 375/376; 375/371; 375/373; 331/14; 331/34; 331/25; 331/1 A
[58] Field of Search .................................. 375/120, 118, 375/119; 331/14, 34, 25, 1 A

[56] References Cited

U.S. PATENT DOCUMENTS 4,234,858  11/1980  Gomi ........................................ 331/34
4,916,412  4/1990   Nordholt et al. .......................... 331/34

OTHER PUBLICATIONS

Bipolar and CMOs Analog Integrated Circuit Design, A. B. Grebene, pp. 668–673, "12.6 Voltage–Controlled Oscillators".

Bipolar and CMOS Analog Integrated Circuit Design, A. B. Grebene, pp. 628–635, "12.1 Principle of a PLL System".

*Primary Examiner*—Stephen Chin
*Assistant Examiner*—Huong Luu
*Attorney, Agent, or Firm*—Oblon, Spivak, McClelland, Maier & Neustadt

[57] ABSTRACT

A PLL device includes a VCO (10) forming a phase-locked loop and an amplifier (18) for outputting a phase change signal having phase function with respect to frequencies, a synthesizer (20) having a first input receiving an error signal (phase comparison signal) from a phase comparator (2) through an LPF (4) and a second input for synthesizing signals at the first and second inputs to output a synthetic signal, and a phase and amplitude changer (15) for changing the phase and amplitude of the synthetic signal to provide a phase and amplitude change signal to the second input of the synthesizer in response to the error signal, the synthetic signal acting as an oscillation signal of the VCO (10), whereby the PLL device has a small variation in free-running frequency and a wide lock range.

10 Claims, 22 Drawing Sheets

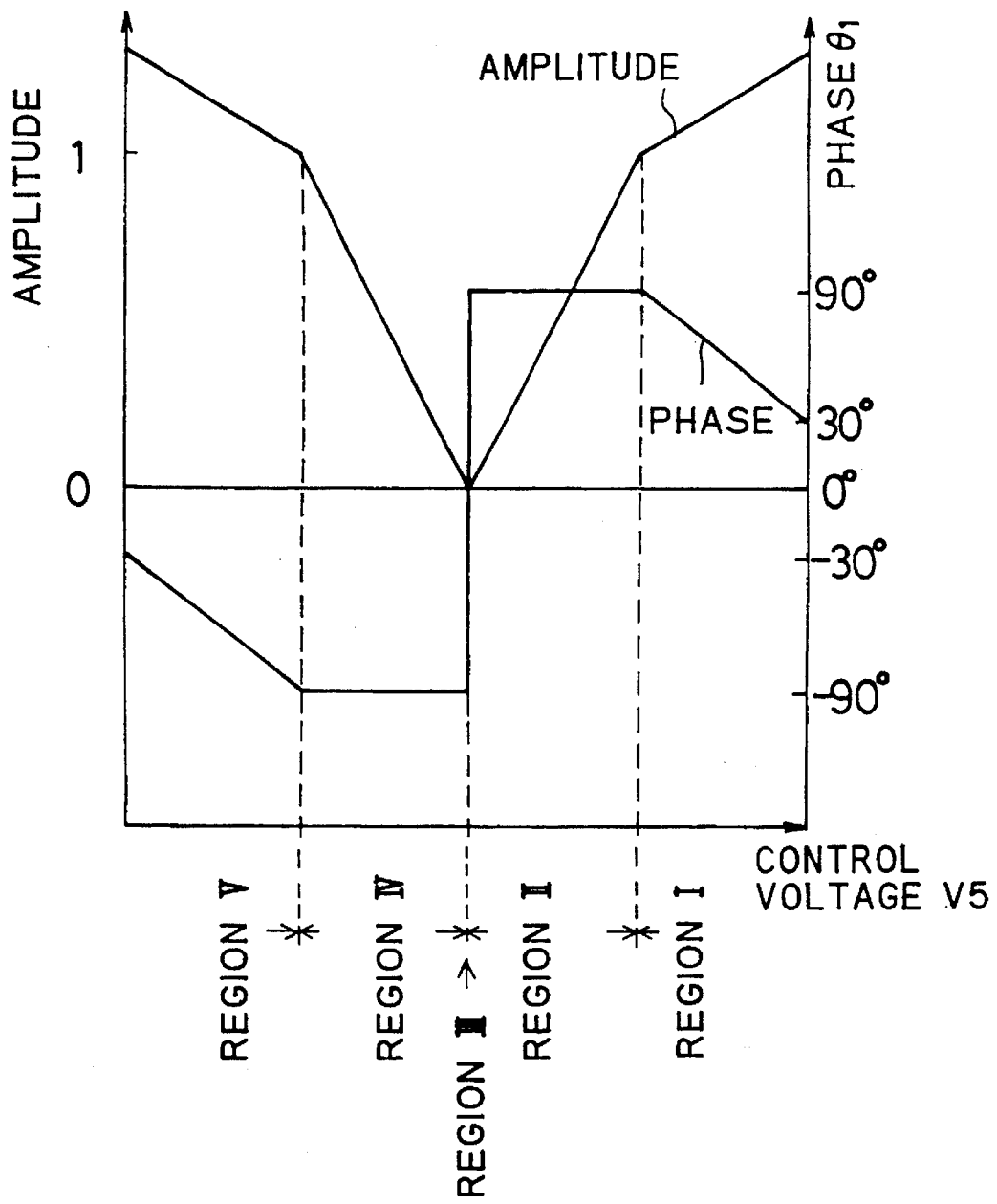

VECTOR B

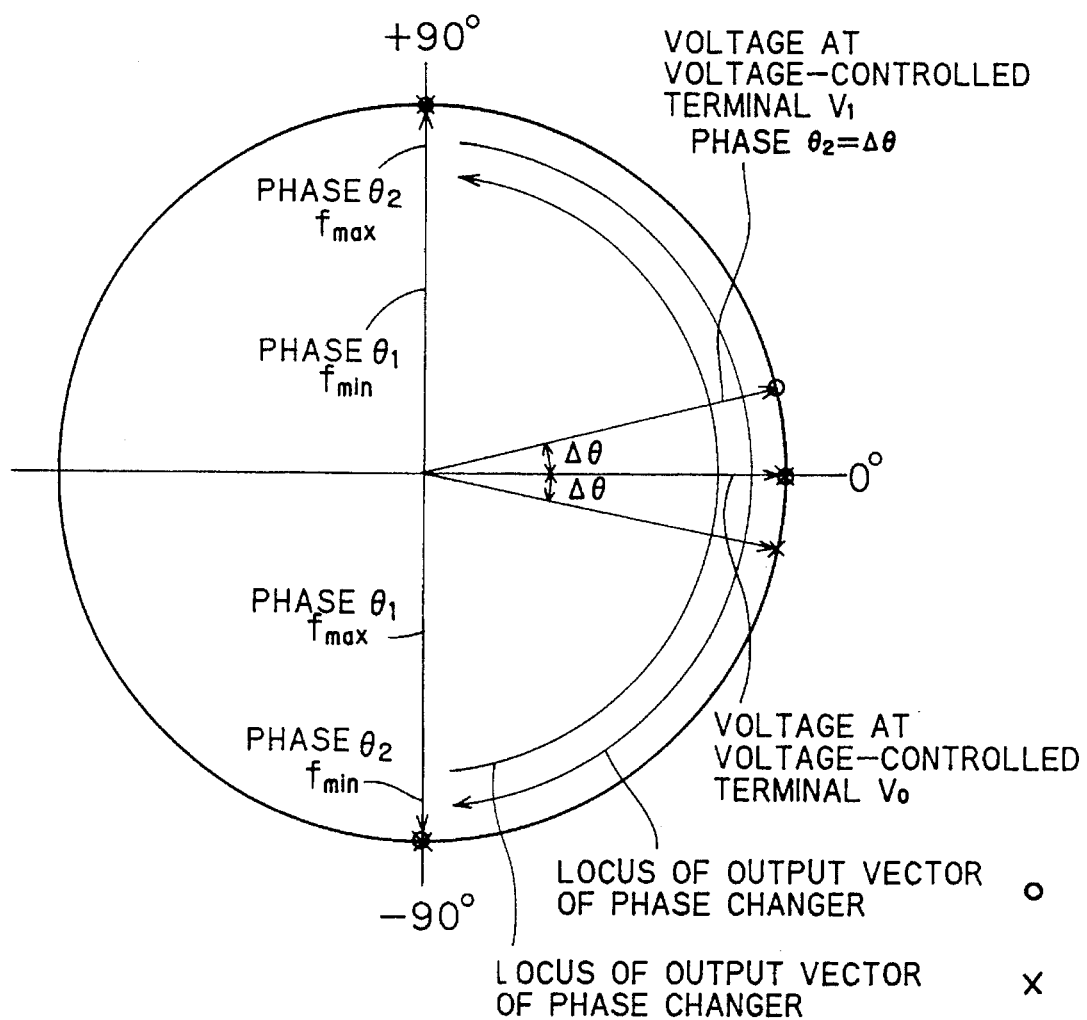

FIG. 22

| Operating Region | | I | II | III | IV | V |
|---|---|---|---|---|---|---|
| Output from Differential Circuit 24 | 24a ($21 > \overline{21}$ → POSITIVE) | POSITIVE | NEGATIVE | NEGATIVE | NEGATIVE | NEGATIVE |
| | 24b | POSITIVE | POSITIVE | NEGATIVE | NEGATIVE | NEGATIVE |
| | 24c ($21 < \overline{21}$ → NEGATIVE) | POSITIVE | POSITIVE | POSITIVE | NEGATIVE | NEGATIVE |
| | 24d | POSITIVE | POSITIVE | POSITIVE | POSITIVE | NEGATIVE |
| Output current and phase of Differential Circuit 27 (Current flow in resistor $R_{15}$ → PRESENT; No current flow in resistor $R_{15}$ → ABSENT) | 27a | PRESENT | ABSENT (PHASE 180°) | ABSENT | ABSENT | ABSENT |
| | 27b | PRESENT | PRESENT (PHASE −90°) | ABSENT | ABSENT | ABSENT |
| | 27c | ABSENT | ABSENT (PHASE +90°) | ABSENT | PRESENT | PRESENT |
| | 27d | ABSENT | ABSENT (PHASE 180°) | ABSENT | ABSENT | PRESENT |
| Output voltage and phase of Amplitude Synthesizer 32 | 32 | AMPLITUDE LARGE→LARGER, PHASE +90°→0° | AMPLITUDE SMALL, PHASE +90° | ABSENT | AMPLITUDE SMALL, PHASE −90° | AMPLITUDE LARGE→LARGER, PHASE −90°→0° |

PHASE-LOCKED LOOP DEVICE, OSCILLATOR, AND SIGNAL PROCESSOR

BACKGROUND OF THE INVENTION

1. Field of the Invention

The present invention relates to a phase-locked loop device (referred to as a PLL hereinafter) for use in a video intermediate frequency amplifying system (referred to as a VIF system hereinafter) and the like, and to a voltage-controlled oscillator (referred to as a VCO hereinafter) for use in the PLL.

2. Description of the Background Art

Recently, there have been increasing demands toward reduction in the number of parts to be adjusted in chassis of TVs and VTRs for the purpose of rationalization. Requirements have accordingly been increased for non-adjustment of exteriorly attached parts for VIF-ICs used in the VIF system. In the past, a PLL has been used in the VIF system, and improvements in video detection and demodulation accuracy have been intended using a synchronization maintaining characteristic of the PLL. For non-adjustment of the exteriorly attached parts of the PLL, it has however been necessary to meet two inconsistent conditions: reduction in free-running frequency variations upon no signal input; and a wide synchronization maintaining range (referred to as a lock range hereinafter).

FIG. 17 illustrates a conventional PLL of an adjustment type used for the VIF system.

In FIG. 17, the reference numeral 1 designates an input terminal receiving an amplified signal which is applied to the VIF system; 2 designates a phase comparator for comparing the phase of the amplified signal with the phase of an oscillator to be described later of the PLL to output an error signal through an output terminal 3; 4 designates a low-pass filter (referred to as a LPF hereinafter) for removing a high-frequency component superimposed on the error signal and passing a frequency area required for the PLL to be stably locked; 6 designates an oscillator which receives the output from the LPF 4 through a voltage-controlled terminal 5 and varies the frequency in accordance with a control voltage applied to the voltage-controlled terminal 5; and 8 and 9 designate a capacitor and a coil, respectively, for determining the free-running frequency of the oscillator 6 and connected between terminals 7a and 7b.

The reference character 10a designates a VCO which outputs the varied frequency as an output signal to the phase comparator 2. Then, a loop based on the phase difference between the amplified input signal and the output signal from the VCO 10a is locked.

The reference character 100a designates portions provided in the form of an integrated circuit.

The background art coil 9 is equipped with an adjusting terminal. By mechanically changing the adjusting terminal, the free-running oscillation frequency of the oscillator 6 may be arbitrarily changed, providing a wide lock range.

The adjustment type PLL is disadvantageous in that it is necessary to change the adjusting terminal mechanically.

FIG. 18 illustrates another conventional PLL which solves the problem of the foregoing PLL.

In FIG. 18, the reference numerals 1 to 5 designate parts identical with those of the PILL of FIG. 17. The reference numeral 11 designates a phase changer for changing the phase by using the control voltage applied to the voltage-controlled terminal 5; and 12 designates an amplifier for changing the phase in accordance the amount of oscillation frequency changes. The amplifier 12 is connected through an input terminal 13 to a quartz oscillator 14 serving as an oscillation source for determining the free-running oscillation frequency.

The reference character 10b designates a VCO for feeding the changed frequency back to the phase changer 11 therein and outputting the changed frequency to the phase comparator 2 as an output therefrom. Then, a loop based on the phase difference between the amplified input signal and the output signal from the VCO 10b is locked.

The reference character 100b designates portions provided in the form of an integrated circuit.

Characteristics of the conventional phase changer 11 are shown in FIG. 19.

As shown, the phase changer 11 has the characteristic of providing an output signal having a constant amplitude and a phase varying from +90° to −90° depending upon a voltage applied to the voltage-controlled terminal 5.

Characteristics of the amplifier 12 are shown in FIG. 20.

As shown, the amplifier 12 has the characteristic of providing an output signal having a constant amplitude and a phase varying depending upon the oscillation frequency.

Operation of the conventional VCO 10b of FIG. 19 will be discussed below with reference to FIGS. 19 and 20. The circuit of FIG. 18 oscillates at a frequency which provides the 360° (0°) phase of a loop composed of the amplifier 12 and the phase changer 11. Changes in phase amount of the phase changer 11 by changing the control voltage applied to the voltage-controlled terminal 5 can change the oscillation frequency of the VCO 10b of FIG. 18.

For example, the phase is θ2 (=0°) when a voltage Vo is applied to the voltage-controlled terminal of the phase changer 11 having the control characteristic shown in FIG. 19, and the amplifier 12 oscillates at an oscillation frequency fo when the amplifier 12 has a phase θ1 (=0°) shown in FIG. 20. At this time, θ1+θ2=360° (0°) is satisfied. Then, if the voltage at the voltage-controlled terminal of the phase changer 11 is changed to V1 as shown in FIG. 19 to lead the phase θ2 of the phase changer 11 by Δθ, the phase of the amplifier 12 is changed to θ1−Δθ which satisfies θ1+θ2= 360° (0°) and the amplifier 12 oscillates at a frequency f1 which provides the phase θ1−Δθ as shown in FIG. 20.

The conventional VCOs for the PLL are constructed as above described. In the PLL of FIG. 17, the oscillation frequency upon no signal input is lacking in accuracy and is required to be necessarily adjusted when the capacitor 8 and the coil 9 are made of discrete parts.

In the PLL of FIG. 18, if a very small input signal is applied to the terminal 1, DC offset of the phase comparator 2 is applied through the LPF 4 to the control terminal 5 of the phase changer 11 as an offset voltage, which causes the free-running oscillation frequency (an oscillation frequency upon no signal input) to be shifted.

In the PLL of FIG. 18, since the variable phase range of the phase changer 11 is ±90° as shown in FIG. 19, the amplifier 12 can oscillate in the range of fmin to fmax corresponding to the phases ±90° of FIG. 20, resulting in the variable phase range of the phase changer being equal to the phase range of the amplifier 12.

This is apparent from the loci of the output vectors of the phase changer 11 and the amplifier 12 shown in FIG. 21.

SUMMARY OF THE INVENTION

According to the present invention, a phase-locked loop device comprises: a phase comparing portion receiving an external input signal and an internal input signal for outputting a phase comparison signal on the basis of a phase difference between the external input signal and the internal input signal, and an oscillating portion receiving the phase comparison signal for outputting the internal input signal oscillating at a frequency based on the phase comparison signal, the phase comparing portion and the oscillating portion forming a phase-locked loop, the oscillating portion including a phase and amplitude changer which receives the phase comparison signal and changes the amplitude of the internal input signal in accordance therewith, and which receives the internal input signal and changes the phase thereof in accordance therewith, and which outputs a phase and amplitude change signal;

an amplifier which receives the internal input signal and outputs a phase change signal in accordance with a frequency of the internal input signal; and a synthesizer which receives the phase and amplitude change signal output from the phase and amplitude changer and the phase change signal output from the amplifier and outputs the internal input signal to the phase and amplitude changer, and the phase comparing portion.

The phase and amplitude changer of the oscillating portion of the phase-locked loop device according to the present invention can perform variable control of the amplitude of the phase and amplitude change signal. The output amplitude of the phase and amplitude change signal is decreased when the external input signal is very small.

Consequently, the phase-locked loop device of the present invention provides a small variation in free-running frequency of the oscillating portion due to offset of the phase comparator.

Preferably, an amplitude of the phase and amplitude change signal of the phase and amplitude changer is permitted to be set to not less than an amplitude of the phase change signal of the amplifier whereby a variable phase range of the phase change signal is wider than a variable phase range of the phase and amplitude change signal.

This provides for a wide variable range of the oscillation frequency of the phase change signal.

Accordingly, the phase-locked loop device has relatively wide capture range and lock range.

Preferably, the amplifier includes an oscillation source for oscillating at a predetermined oscillation frequency serving as a reference of the oscillation frequency of the phase change signal, and a reactance element for preventing the oscillation source from oscillating at a frequency outside a desired frequency region.

The reactance element prevents the oscillation source from oscillating at a frequency different from the set frequency.

Preferably, the phase-locked loop device further comprises a low-pass filter connected between the phase comparing portion and the oscillating portion and receiving the phase comparison signal for removing a high frequency component superimposed upon the phase comparison signal to transmit the output signal to the oscillating portion.

The provision of the low-pass filter for removing the high-frequency component superimposed on the phase comparison signal enables a required frequency region of the phase comparison signal to pass and, as a result, a stable phase-locked loop is locked.

The present invention is also intended as an oscillator. According to the present invention, the oscillator comprises:

a phase and amplitude changer which receives an external control signal and changes the amplitude of an internal control signal in accordance therewith, and which receives the internal control signal and changes the phase thereof in accordance therewith, and which outputs a phase and amplitude change signal; an amplifier which receives the internal control signal and outputs a phase change signal in accordance with the frequency of the internal control signal; and a synthesizer which receives the phase and amplitude change signal output from the phase and amplitude changer and the phase change signal output from the amplifier and outputs the internal control signal to the phase and amplitude changer and the amplifier, wherein an amplitude of the phase and amplitude change signal is set to not less than an amplitude of the phase change signal, a variable phase range of the phase change signal being wider than a variable phase range of the phase and amplitude change signal.

The variable range of the oscillation frequency of the phase change signal is enlarged.

Consequently, the oscillator of the present invention has a relatively wide capture range.

The present invention is also intended as a signal processor. According to the present invention, the signal processor comprises:

a signal detector which receives an external input signal and internal control signal and which detects the external input signal and outputs a detection signal in response to the internal control signal; a phase comparator which receives the external input signal and the internal control signal and outputs a phase comparison signal representing a phase difference between the external input signal and the internal control signal; an oscillator which receives the phase comparison signal and outputs the internal control signal, the oscillator including a phase and amplitude changer which receives the phase comparison signal and changes the amplitude of the internal control signal in accordance therewith, and which receives the internal control signal and changes the phase thereof in accordance therewith, and which outputs a phase and amplitude change signal; an amplifier which receives the internal control signal and outputs a phase change signal in accordance with a frequency of the internal control signal; and a synthesizer which receives the phase and amplitude change signal output from the phase and amplitude changer and the phase change signal output from the amplifier and outputs the internal control signal to the phase and amplitude changer, the amplifier, and the phase comparator.

The phase and amplitude changer of the oscillating portion of the signal processor according to the present invention can perform variable control of the amplitude of the phase and amplitude change signal. The output amplitude of the phase and amplitude change signal is decreased when the external input signal is very small.

Consequently, the phase-locked loop formed in the signal processor of the present invention provides a small variation in free-running frequency of the oscillating portion due to offset of the phase comparator.

Preferably, an amplitude of the phase and amplitude change signal of the phase and amplitude changer is permitted to be set to not less than an amplitude of the phase change signal of the amplifier, whereby a variable phase range of the phase change signal is wider than a variable phase range of the phase and amplitude change signal.

The variable range of the oscillation frequency of the phase change signal is enlarged.

Consequently, the phase-locked loop formed in the signal processor of the present invention has relatively wide capture range and lock range.

It is an object of the present invention to ensure a wide variable frequency range and to provide a narrow variation in free-running oscillation frequency.

These and other objects, features, aspects and advantages of the present invention will become more apparent from the following detailed description of the present invention when taken in conjunction with the accompanying drawings.

BRIEF DESCRIPTION OF THE DRAWINGS

FIG. 9 is an illustration similar to FIG. 8, with the range of an operating region III represented as a point;

FIG. 21 illustrates the loci of the output vectors of the phase changer 11 and the amplifier 12 of FIG. 18; and FIG. 22 illustrates outputs from the phase and amplifier changer 15 of FIG. 2 in the respective operating regions.

DESCRIPTION OF THE PREFERRED EMBODIMENTS

Figure 1:
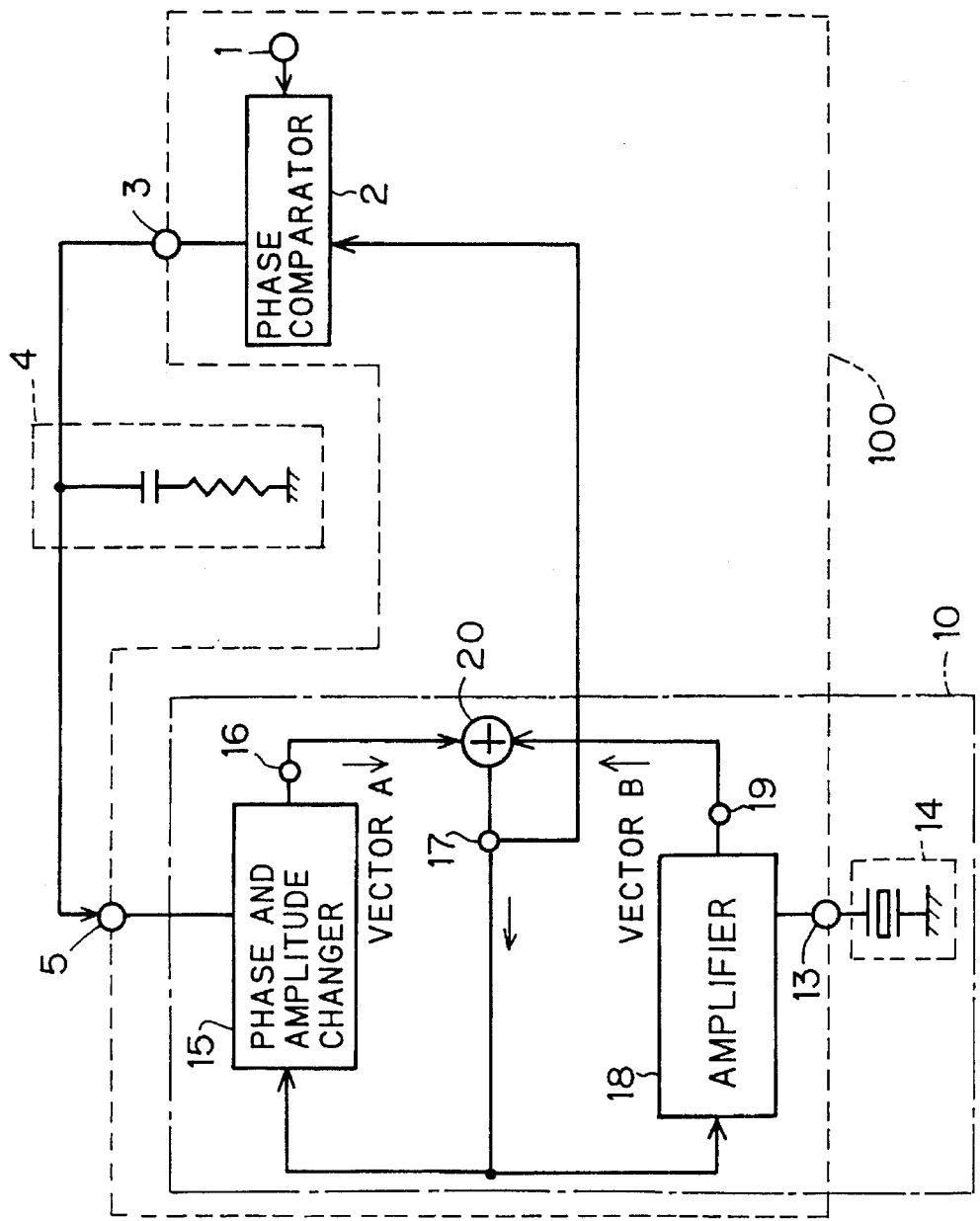
FIG. 1 illustrates a PLL of a preferred embodiment according to the present invention.

FIG. 1 illustrates a PLL circuit according to a preferred embodiment of the present invention.

In FIG. 1, the reference numeral 1 designates an input terminal receiving an amplified signal applied to a VIF system; 2 designates a phase comparator for comparing the phase of the amplified signal with the phase of a VCO to be described later of the PLL to output an error signal (phase comparison signal) through an output terminal 3; and 4 designates an LPF for removing a high-frequency component superimposed on the error signal and passing a frequency region required for the PLL to be stably locked. The LPF 4 includes a resistor and a capacitor which are connected in series.

The reference numeral 15 designates a phase and amplitude changer which receives through a voltage-controlled terminal 5 the error signal from which the high-frequency component is removed by the LPF 4. The phase and amplitude changer 15 changes the amplitude of a phase and amplitude change signal to be outputted to a node 16 on the basis of the voltage of the error signal and changes the phase of the phase and amplitude change signal to be outputted to the node 16 in response to a signal given from a node 17. The reference numeral 18 designates an amplifier responsive to the frequency of the signal given from the node 17 for outputting to a node 19 a phase change signal which is phase-changed with respect to the input signal. That is, the amplifier 18 has a predetermined phase function with respect to the frequency of the input signal. The amplifier 18 is connected through an input terminal 13 to a quartz oscillator or a ceramic resonator 14 serving as an oscillation source for determining a free-running oscillation frequency.

The reference numeral 20 designates a synthesizer having a first input connected to the node 19 receiving the phase change signal which is phase controlled from the amplifier 18 and a second input connected to the node 16 receiving the phase and amplitude change signal which is amplitude and phase controlled from the phase and amplitude changer 15, and synthesizing the phase change signal and the phase and amplitude change signal to output a synthetic signal to the node 17. The synthesizer 20 provides a feedback output to the phase and amplitude changer 15 and the amplitude 18 and provides the output to the phase comparator 2 as an output from a VCO 10 composed of the phase and amplitude changer 15, the amplifier 18, an oscillator 14, and the synthesizer 20. Then, a loop based on the phase difference between the amplified input signal and the output signal from the VCO 10 is locked.

The reference numeral 100 designates portions provided in the form of an integrated circuit. The LPF 4, if having the capacitor whose capacitance is permitted to be integrated, may be included in the portions 100.

Figure 2:
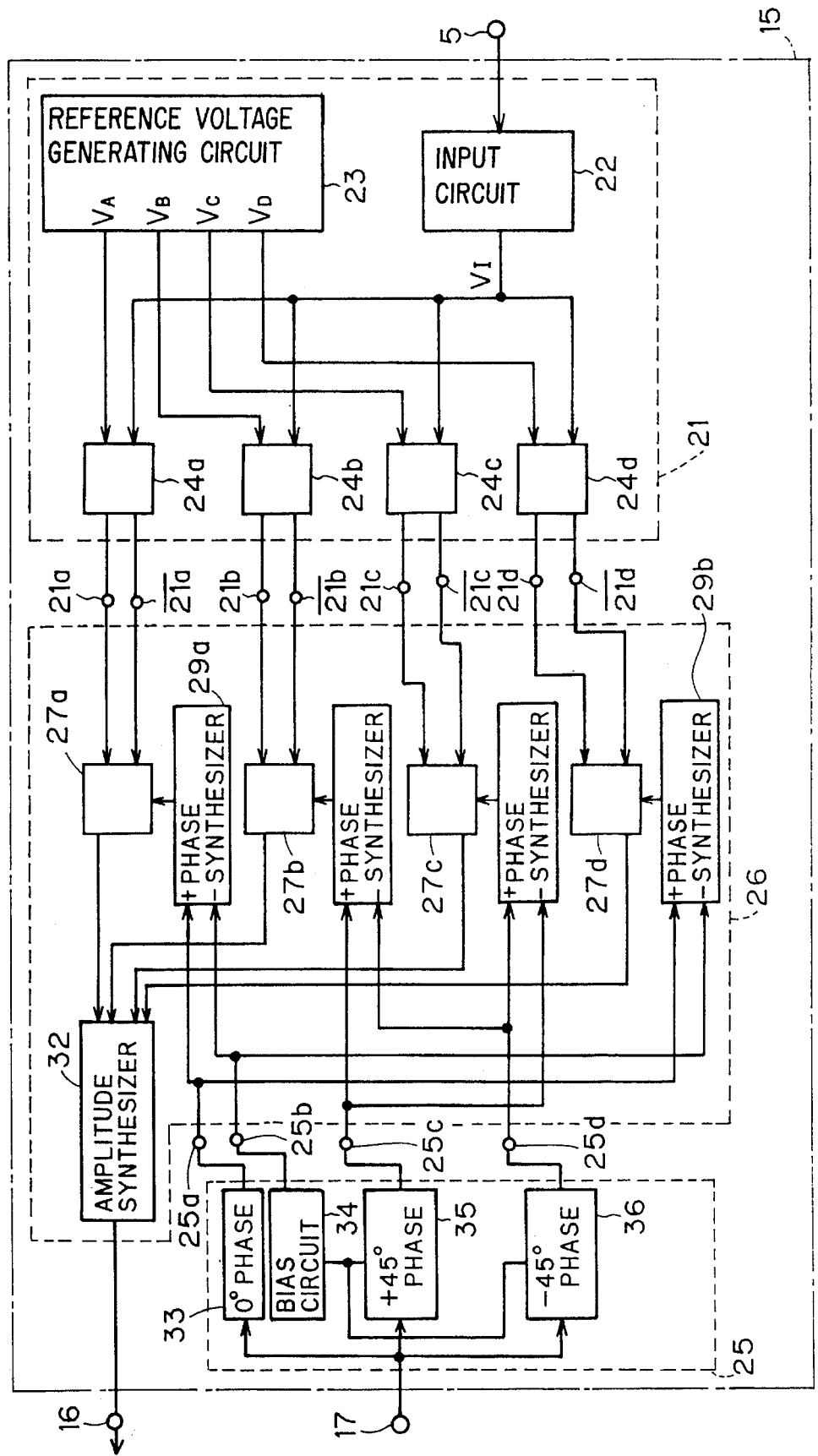
FIG. 2 is an internal block diagram of a phase and amplitude changer 15 shown in FIG. 1.

FIG. 2 is an internal block diagram of the phase and amplitude changer 15.

In FIG. 2, the reference numeral 21 designates a variable amplitude controller receiving from the voltage-controlled terminal 5 the error signal from which the high-frequency component is removed by the LPF 4 and outputting an amplitude control signal based on the voltage of the error signal to nodes $21a$, $\overline{21c}$, . . . $21d$, $\overline{21d}$. The variable amplitude controller 21 includes an input circuit 22 receiving the error signal, a reference voltage generating circuit 23 for producing different reference potentials ($V_A$, $V_B$, $V_C$, $V_D$ in descending order of potential), and differential circuits $24a$ to $24d$ for comparing the different reference potentials with a potential VI of a signal based on the error signal outputted from the input circuit to produce the amplitude control signal.

The differential circuits 24a to 24d output potential differences in accordance with the differences between the respective reference potentials and the potential VI of the signal based on the error signal (referred to as differential outputs hereinafter) through the respective output nodes 21 and $\overline{21}$ (general terms of the nodes 21a, $\overline{21a}$, . . . 21d, $\overline{21d}$). When the signal potential VI is higher than the reference potential, the output potential at the node 21 is higher than the output potential at the node $\overline{21}$. These outputs are referred to as positive outputs hereinafter. Conversely, when the signal potential VI is lower than the reference potential, the output potential at the node 21 is lower than the output potential at the node $\overline{21}$. These outputs are referred to as negative outputs hereinafter.

The reference numeral 25 designates a phase controller receiving the synthetic signal from the synthesizer 20 through the node 17 to output phase control signals which change the phase in response to the synthetic signal to nodes 25a to 25d. The phase controller 25 includes a 0° phase circuit 33, a bias circuit 34, a +45° phase converter circuit 35, and a −45° phase converter circuit 36.

The reference numeral 26 designates a phase and amplitude synthesizer receiving the amplitude control signal and the phase control signal to output a phase and amplitude synthesized signal to the node 16. The phase and amplitude synthesizer 26 includes: phase synthesizers 29a and 29b for calculating a phase difference between the 0° phase circuit 33 and the bias circuit 34 to output 180° phase; a phase synthesizer 30 for calculating a phase difference between the +45° phase converter circuit 35 and the −45° phase converter circuit 36 to output −90° phase; and a phase synthesizer 31 for calculating a phase difference between the −45° phase converter circuit 36 and the +45° phase converter circuit 35 to output +90° phase. The phase and amplitude synthesizer 26 further includes differential circuits 27a, 27b, 27c, 27d. The differential circuit 27a receives the differential outputs from the differential circuit 24a receiving the reference potential $V_A$ and the signal potential VI and also receives the output from the phase synthesizer 29a. The differential circuit 27a provides output current at the phase angle of 180° with respect to the synthetic signal of the synthesizer 20 when the differential outputs are the positive outputs, and provides no current when the differential outputs are the negative outputs. The differential circuit 27b receives the differential outputs from the differential circuit 24b receiving the reference potential $V_B$ and the signal potential VI and also receives the output from the phase synthesizer 30. The differential circuit 27b provides output current at the phase angle of −90° with respect to the synthetic signal of the synthesizer 20 when the differential outputs are the positive outputs, and provides no current when the differential outputs are the negative outputs. The differential circuit 27c receives the differential outputs from the differential circuit 24c receiving the reference potential $V_C$ and the signal potential VI and also receives the output from the phase synthesizer 31. The differential circuit 27c provides output current at the phase angle of +90° with respect to the synthetic signal of the synthesizer 20 when the differential outputs are the negative outputs, and provides no current when the differential outputs are the positive outputs. The differential circuit 27d receives the differential outputs from the differential circuit 24d receiving the reference potential $V_D$ and the signal potential VI and also receives the output from the phase synthesizer 29b. The differential circuit 27d provides output current at the phase angle of 180° with respect to the synthetic signal of the synthesizer 20 when the differential outputs are the negative outputs, and provides no current when the differential outputs are the positive outputs. The phase and amplitude synthesizer 26 further includes an amplitude synthesizer 32 for synthesizing the output currents of the differential circuits 27a to 27d and converting the synthesized current into voltage to generate the phase and amplitude synthesized signal. The output from the amplitude synthesizer 32 is connected to the node 16.

Figure 3:
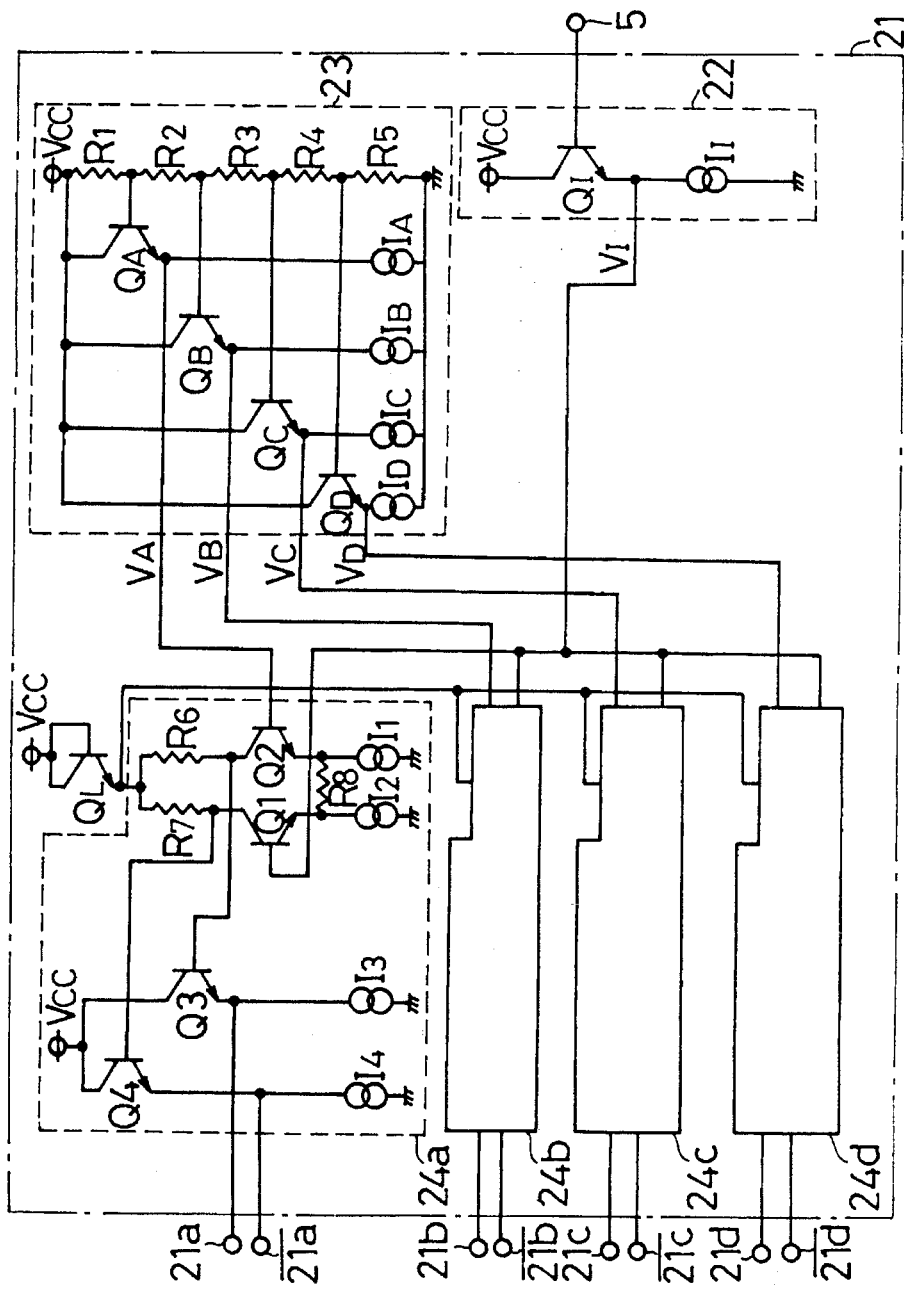
FIG. 3 is a circuit diagram of a variable amplitude controller 21 shown in FIG. 2.

FIG. 3 is a circuit diagram of the variable amplitude controller 21.

Referring to FIG. 3, the input circuit 22 includes a transistor $Q_I$ having a base connected to the voltage-controlled terminal 5, a collector connected to a power supply voltage Vcc, and an emitter grounded through a constant current source $I_I$. The signal potential VI is outputted from the emitter of the transistor $Q_I$.

The reference potential generating circuit 23 includes resistors R1 to R5 connected in series between the power supply voltage Vcc and ground, and transistors $Q_A$ to $Q_D$ having bases connected to the connecting points of the resistors, collectors connected to the power supply voltage Vcc, and emitters grounded through corresponding constant current sources $I_A$ to $I_D$, respectively. The reference potentials $V_A$ to $V_D$ are outputted from the emitters of the transistors $Q_A$ to $Q_D$, respectively. The output reference potentials $V_A$ to $V_D$ are determined by the divided voltage ratio of the resistors R1 to R5 connected in series.

The differential circuits 24a to 24d are similar in construction, and the construction of the differential circuit 24a is depicted as a representative.

The differential circuit 24a includes transistors Q1 to Q4. The transistor Q1 has a base receiving the signal potential VI, a collector connected to the power supply voltage Vcc through a resistor R7, and an emitter grounded through a constant current source I2. The transistor Q2 has a base receiving the reference potential $V_A$, a collector connected to the power supply voltage Vcc through a resistor R6, and an emitter grounded through a constant current source I1. The transistor Q3 has a base connected to the collector of the transistor Q2, a collector connected to the power supply voltage Vcc, and an emitter grounded through a constant current source I3. The transistor Q4 has a base connected to the collector of the transistor Q1, a collector connected to the power supply voltage Vcc, and an emitter grounded through a constant current source I4. The emitter of the transistor Q3 is connected to the node 21a, and the emitter of the transistor Q4 is connected to the node $\overline{21a}$. The differential outputs are provided from the two nodes.

A transistor $Q_L$ is connected between the power supply voltage Vcc and the resistors R7, R6 and functions as a level shifter for shifting down the amplitude range of the differential outputs to prevent a transistor receiving the differential outputs from operating in a saturated condition.

Figure 4:
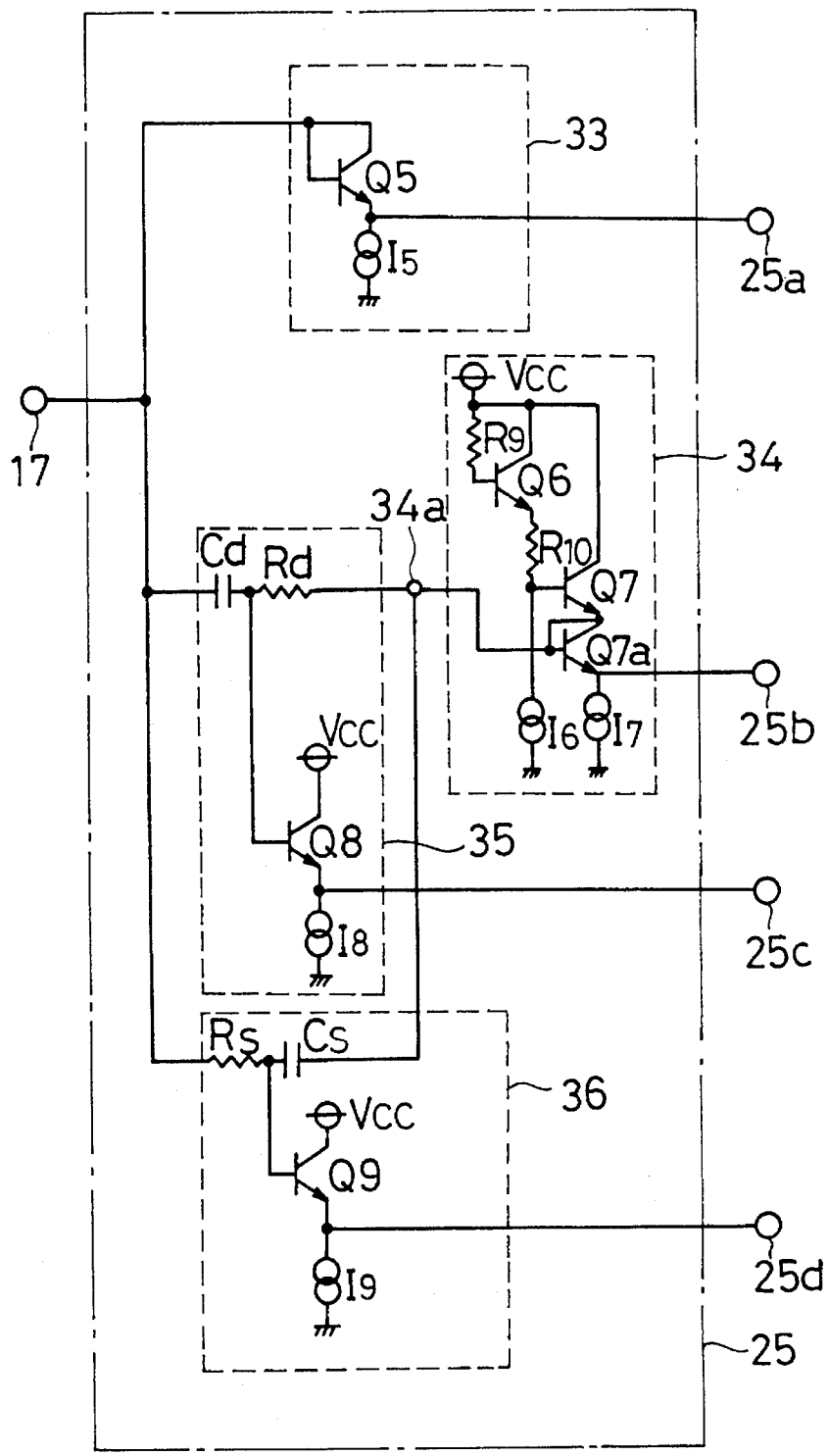
FIG. 4 is a circuit diagram of a phase controller 25 shown in FIG. 2.

FIG. 4 is a circuit diagram of the phase controller 25.

Referring to FIG. 4, the 0° phase circuit 33 includes a transistor Q5 having base and collector connected to the node 17 receiving the synthetic signal from the synthesizer 20, and an emitter grounded through a constant current source I5. The emitter of the transistor Q5 is connected to the node 25a through which the 0° phase circuit 33 outputs the phase control signal for the 0° phase in response to the synthetic signal.

The bias circuit 34 includes transistors Q6, Q7, Q7a. The transistor Q6 has a base connected to the power supply voltage Vcc through a resistor R9, a collector connected to the power supply voltage Vcc, and an emitter grounded through a resistor R10 and a constant current source I6. The transistor Q7 has a base connected to the connecting point of the resistor R10 and the constant current source I6, a collector connected to the power supply voltage Vcc, and an emitter connected to a node 34a for outputting a first bias potential. The transistor Q7a has base and collector connected to the node 34a, and an emitter grounded through a constant current source I7. The emitter of the transistor Q7a is connected to the node 25b through which the bias circuit 34 outputs a second bias potential serving as a 0° phase reference signal.

The +45° phase converter circuit 35 includes a capacitor Cd, a resistor Rd, and a transistor Q8. The capacitor Cd and the resistor Rd are connected in series between the node 17 and the node 34a outputting the first bias potential. The transistor Q8 has a base connected to the connecting point of the capacitor Cd and the resistor Rd, a collector connected to the power supply voltage Vcc, and an emitter grounded through a constant current source I8. The emitter of the transistor Q8 is connected to the node 25c through which the +45° phase converter circuit 35 outputs the phase control signal for the +45° phase in response to the synthetic signal.

The +45° phase conversion is executed by a differentiating circuit composed of the capacitor Cd and the resistor Rd.

The −45° phase converter circuit 36 includes a resistor Rs, a capacitor Cs, and a transistor Q9. The resistor Rs and the capacitor Cs are connected in series between the node 17 and the node 34a outputting the first bias potential. The transistor Q9 has a base connected to the connecting point of the resistor Rs and the capacitor Cs, a collector connected to the power supply voltage Vcc, and an emitter grounded through a constant current source I9. The emitter of the transistor Q9 is connected to the node 25d through which the −45° phase converter circuit 36 outputs the phaser control signal for the −45° phase in response to the synthetic signal.

The −45° phase conversion is executed by an integrating circuit composed of the resistor Rs and the capacitor Cs.

Figure 5:
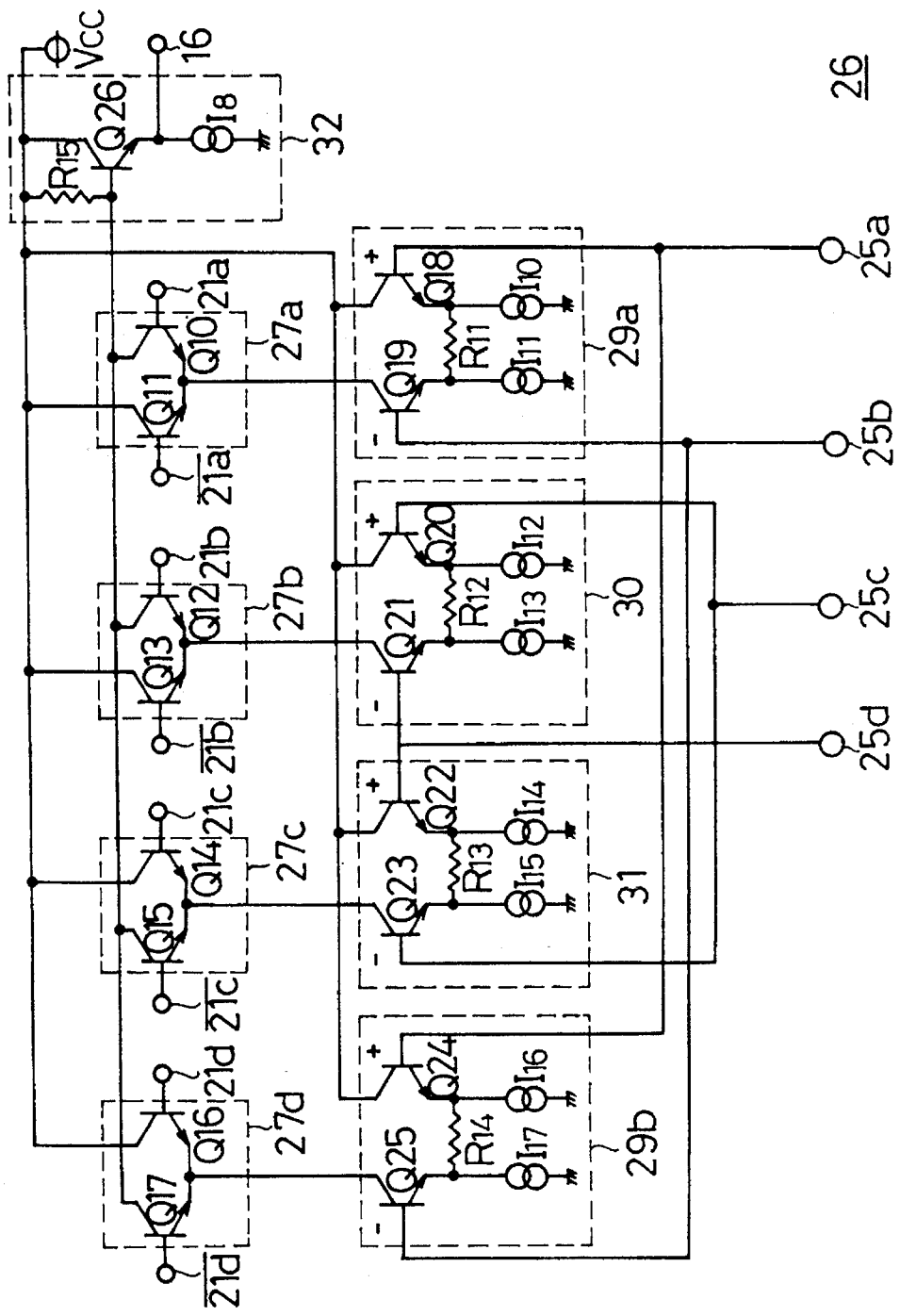
FIG. 5 is a circuit diagram of a phase and amplitude synthesizer 26 shown in FIG. 2.

FIG. 5 is a circuit diagram of the phase and amplifier synthesizer 26.

Referring to FIG. 5, the phase synthesizer 29a includes transistors Q18, Q19, and a resistor R11. The transistor Q18 has a base connected to the node 25a, a collector connected to the power supply voltage Vcc, and an emitter grounded through a constant current source I10. The transistor Q19 has a base connected to the node 25b, a collector connected to the differential circuit 27a, and an emitter grounded through a constant current source I11. The resistor R11 connects the emitters of the transistors Q18 and Q19 to each other. The phase synthesizer 29a outputs a 180° phase signal to the differential circuit 27a. The signal is 180° phase inverted in the amplitude synthesizer 32, consequently corresponding to a 0° phase voltage signal.

The phase synthesizer 29b includes transistors Q24, Q25, and a resistor R14. The transistor Q24 has a base connected to the node 25a, a collector connected to the power supply voltage Vcc, and an emitter grounded through a constant current source I16. The transistor Q25 has a base connected to the node 25b, a collector connected to the differential circuit 27d, and an emitter grounded through a constant current source I17. The resistor R14 connects the emitters of the transistors Q24 and Q25 to each other. The phase synthesizer 29b outputs a 180° phase signal to the differential circuit 27d. The signal is 180° phase inverted in the amplitude synthesizer 32, consequently corresponding to a 0° phase voltage signal.

The phase synthesizer 30 includes transistors Q20, Q21, and a resistor R12. The transistor Q20 has a base connected to the node 25c, a collector connected to the power supply voltage Vcc, and an emitter grounded through a constant current source I12. The transistor Q21 has a base connected to the node 25d, a collector connected to the differential circuit 27b, and an emitter grounded through a constant current source I13. The resistor R12 connects the emitters of the transistors Q20 and Q21 to each other. The phase synthesizer 30 outputs a −90° phase signal to the differential circuit 27b. The signal is 180° phase inverted in the amplitude synthesizer 32, consequently corresponding to a +90° phase voltage signal.

The phase synthesizer 31 includes transistors Q22, Q23, and a resistor R13. The transistor Q22 has a base connected to the node 25d, a collector connected to the power supply voltage Vcc, and an emitter grounded through a constant current source I14. The transistor Q23 has a base connected to the node 25c, a collector connected to the differential circuit 27c, and an emitter grounded through a constant current source I15. The resistor R13 connects the emitters of the transistors Q22 and Q23 to each other. The phase synthesizer 31 outputs a +90° phase signal to the differential circuit 27c. The signal is 180° phase inverted in the amplitude synthesizer 32, consequently corresponding to a −90° phase voltage signal.

The differential circuit 27a includes a transistor Q10 having a base connected to the node 21a, a collector connected to the amplitude synthesizer 32, and an emitter connected to the phase synthesizer 29a, and a transistor Q11 having a base connected to the node $\overline{21a}$, a collector connected to the power supply voltage Vcc, and an emitter connected to the emitter of the transistor Q10. The differential circuit 27a provides the output current flow at 180° phase angle when the potential at the node 21a is higher than the potential at the node $\overline{21a}$, and provides no current flow when the potential at the node 21a is lower than the potential at the node $\overline{21a}$.

The differential circuit 27b includes a transistor Q12 having a base connected to the node 21b, a collector connected to the amplitude synthesizer 32, and an emitter connected to the phase synthesizer 30, and a transistor Q13 having a base connected to the node $\overline{21b}$, a collector connected to the power supply voltage Vcc, and an emitter connected to the emitter of the transistor Q12. The differential circuit 27b provides the output current flow at −90° phase angle when the potential at the node 21b is higher than the potential at the node $\overline{21b}$, and provides no current flow when the potential at the node 21b is lower than the potential at the node $\overline{21b}$.

The differential circuit 27c includes a transistor Q14 having a base connected to the node 21c, a collector connected to the power supply voltage Vcc, and an emitter connected to the phase synthesizer 31, and a transistor Q15 having a base connected to the node $\overline{21c}$, a collector connected to the amplitude synthesizer 32, and an emitter connected to the emitter of the transistor Q14. The differential circuit 27c provides the output current flow at +90° phase angle when the potential at the node 21c is lower than the potential at the node $\overline{21c}$, and provides no current flow when the potential at the node 21c is higher than the potential at the node $\overline{21c}$.

The differential circuit 27d includes a transistor Q16 having a base connected to the node 21d, a collector connected to the power supply voltage Vcc, and an emitter connected to the phase synthesizer 29b, and a transistor Q17 having a base connected to the node $\overline{21d}$, a collector connected to the amplitude synthesizer 32, and an emitter connected to the emitter of the transistor Q16. The differential circuit 27d provides the output current flow at 180° phase angle when the potential at the node 21d is lower than the potential at the node $\overline{21d}$, and provides no current flow when the potential at the node 21d is higher than the potential at the node $\overline{21d}$.

The amplitude synthesizer 32 includes a resistor R15 connected between the outputs from the differential circuits 27a to 27d and the power supply voltage Vcc, and a transistor Q26 having a base connected to the connecting point of the resistor R15 and the differential circuit outputs, a collector connected to the power supply voltage Vcc, and an emitter grounded through a constant current source I18. The emitter of the transistor Q26 is connected to the node 16. The resistor R15 converts the output currents from the differential circuits 27a to 27d into a 180° phase inverted output voltage, which are outputted through the node 16 to the synthesizer 20 as the phase and amplitude change signal having the converted phase and amplitude.

Operation of the phase and amplitude changer 15 will be discussed below on the basis of the signal applied to the voltage-controlled terminal 5.

Figure 6:
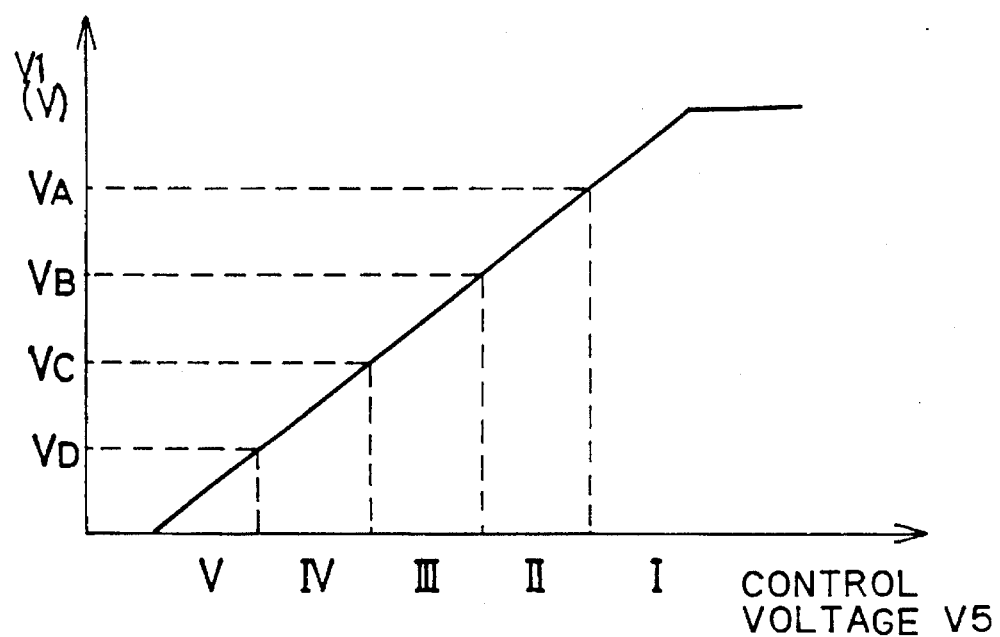
FIG. 6 illustrates an operating region of the phase and amplitude changer 15 of FIG. 2.

FIG. 6 is a graph showing changes in potential VI of the signal applied to the input circuit 22 with respect to a control signal V5 applied to the voltage-controlled terminal 5.

As shown, the operating region of the VCO 10 is divided into operating regions I to V of the control voltage V5 depending upon potential relation between the signal potential VI and the reference potential $V_A$ to $V_D$.

The operating region I is a region of the control voltage V5 which satisfies $VI \geq V_A$. The operating region II is a region of the control voltage V5 which satisfies $V_A > VI \geq V_B$. The operating region III is a region of the control voltage V5 which satisfies $V_B > VI > V_C$. The operating region IV is a region of the control voltage V5 which satisfies $V_C \geq VI > V_D$. The operating region V is a region of the control voltage V5 which satisfies $V_D \geq VI$. There are shown in FIG. 22, in the respective operating regions I to V, the outputs from the respective differential circuits 24a to 24d which are the outputs from the variable amplifier controller 21, the outputs from the differential circuits 27a to 27d receiving the phase synthesized outputs from the phase controller 25 and the outputs from the variable amplitude controller 21, and the output from the amplitude synthesizer 32 which is the synthetic signal of the outputs from the differential circuits 27a to 27d.

Referring to FIG. 22, the differential circuits 27a and 27b provide the output currents in the operating region I. As the signal potential VI decreases, the frequency of the output from the amplitude synthesizer 32 decreases and the phase thereof changes from 0° to +90°.

In the operating region II, only the differential circuit 27b provides the output current. The frequency of the output from the amplitude synthesizer 32 decreases as the signal potential VI decreases, and the phase thereof is +90°.

In the operating region III, no output currents are provided from the differential circuit 27a to 27d, and the amplitude synthesizer 32 provides no output. Then the VCO oscillates at the flee-running oscillation frequency. It should be noted that the control voltage V5 at this time lies in the operating region III of FIG. 6.

In the operating region IV, only the differential circuit 27c provides the output current. The frequency of the output from the amplitude synthesizer 32 increases as the signal potential VI decreases, and the phase thereof is −90°.

In the operating region V, the differential circuits 27c and 27d provide the output currents. As the signal potential VI decreases, the frequency of the output from the amplitude synthesizer 32 increases and the phase thereof changes from 90° to 0°.

Figure 7:
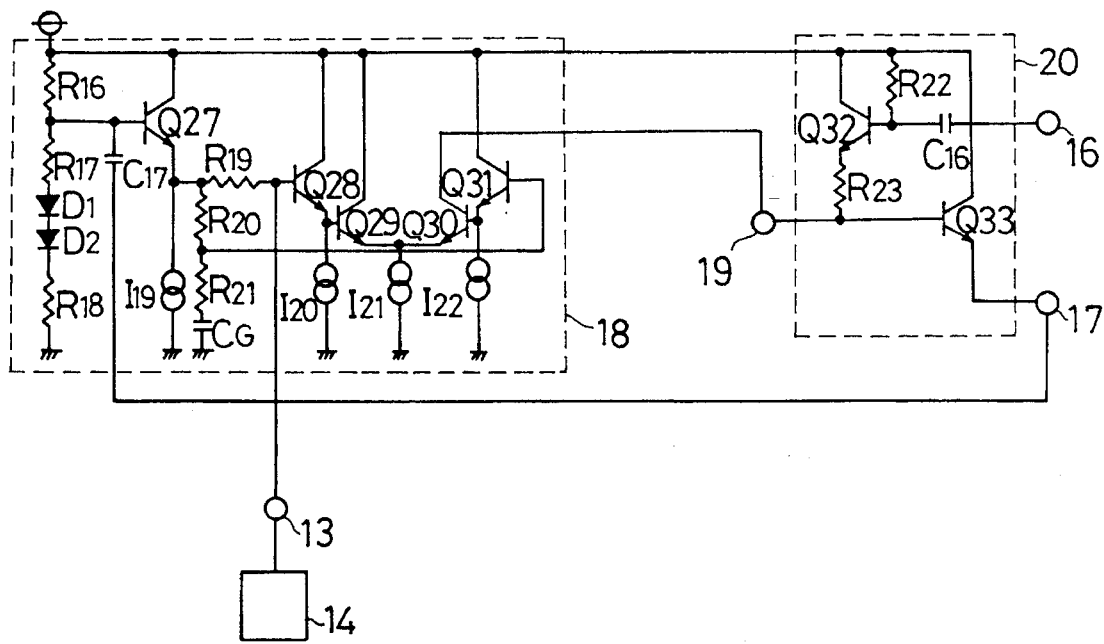
FIG. 7 is a circuit diagram of an amplifier 18 and a synthesizer 20 shown in FIG. 1.

FIG. 7 is a circuit diagram of the amplifier 18 and the synthesizer 20.

Referring to FIG. 7, the amplifier 18 includes resistors R16, R17, diodes D1, D2, and a resistor R18 which are connected in series between the power supply voltage Vcc and ground, and generates a reference potential at the connecting point of the resistors R16 and R17. The amplifier 18 further includes transistors Q27 to Q31 and a capacitor C17. The transistor Q27 has a base receiving the reference potential, a collector connected to the power supply voltage Vcc, and an emitter grounded through a constant current source I19. The transistor Q28 has a base connected to the emitter of the transistor Q27 through a resistor R19, a collector connected to the power supply voltage Vcc, and an emitter grounded through a constant current source I20. The transistor Q31 has a base connected to the emitter of the transistor Q27 through a resistor R20, a collector connected to the power supply voltage Vcc, and an emitter grounded through a constant current source I22. A resistor R21 and a capacitor $C_G$ are connected in series between the base of the transistor Q31 and ground. The transistor Q29 has a base connected to the emitter of the transistor Q28, a collector connected to the power supply voltage Vcc, and an emitter grounded through a constant current source I21. The transistor Q30 has a base connected to the emitter of the transistor Q31, a collector connected to a node 19 which is an output node of the amplifier 18, and an emitter connected to the emitter of the transistor Q29. The capacitor C17 connects the output node 17 of the synthesizer 20 to the base of the transistor Q27. The base of the transistor Q28 is connected to the oscillation source 14 through the node 13.

The capacitor 17 transmits only the amount of amplitude changes of the synthesizer 20 to the base of the transistor Q27, that is, functions as a so-called pass capacitor which does not transmit DC components but AD components.

The transistors Q28 to Q31 and the constant current sources I20 to I22 serve as a differential amplifier whose first input is the base of the transistor Q28 and whose second input is the base of the transistor Q31. The resistors R19 to R21, and the oscillation source 14 form a bridge circuit at a differential input of the differential amplifier.

The capacitor $C_G$ connected between the resistor R21 and ground is designed for preventing oscillation in a low frequency region. When the free-running oscillation frequency is set to about 42 MHz according to the construction of the present invention, a plurality of resonance points of the oscillator 14 cause oscillation at a frequency lower than the set frequency. Use of the bridge circuit including the capacitor $C_G$ prevents oscillation at a frequency different from the set frequency.

The synthesizer 20 includes a transistor Q32, a resistor R22, and a transistor Q33. The transistor Q32 has a base connected to the output node 16 of the phase and amplitude changer 15 through a capacitor C16, a collector connected to the power supply voltage Vcc, and an emitter connected to the output node 19 of the amplifier 18 through a resistor R23. The resistor R22 is connected between the power supply voltage Vcc and the base of the transistor Q32 and supplies the base current of the transistor Q32. The transistor Q33 has a base connected to the emitter of the transistor Q32 through the resistor R23, a collector connected to the power supply voltage Vcc, and an emitter connected to the output node 17 of the synthesizer 20.

The capacitor C16 transmits only the amount of amplitude changes of the phase and amplitude change signal Of the phase and amplitude changer 15 to the base of the transistor Q32, that is, functions as a so-called pass capacitor which does not transmit DC components but AC components.

The transistor Q32 receives at its base the amount of amplitude changes of the phase and amplitude change signal of the phase and amplitude changer 15 from the capacitor C16. The resistor R23 has a first end connected to the emitter of the transistor Q32 and a second end receiving the output voltage of the amplifier 18.

The amplitude applied to the base of the transistor Q32 and the amplitude generated at the resistor R23 by the collector current of the transistor Q30 are synthesized, and the synthesized signal is applied to the base of the transistor Q33 and is then outputted from the emitter of the transistor Q33 as the synthetic signal of the synthesizer 20.

Construction of the VCO and operation of the phase and amplitude changer in the PLL circuit are described heretofore according to the present invention. Description will be given hereinafter on the reason why the lock range of the PLL is enlarged by using the VCO.

It is assumed that the output from the node 17 of the synthesizer 20 has a reference amplitude 1 and a reference phase 0° and is represented as a vector R. The phase and amplitude change signal given from the node 16 of the phase and amplitude changer 15 is represented as a vector A, and the phase change signal (voltage output generated at the resistor R23 of the synthesizer 20) given from the node 19 of the amplifier 18 is represented as a vector B. The vector A has a phase θ2, and the vector B has a phase θ1.

For oscillation, the phase of the vector R(=A+B) synthesized in the synthesizer 20 is 0°, and the amplitude thereof is not less than 1.

$$A+B=R, \; R \geq 1, \; \theta(R)=0°$$

Figure 8:
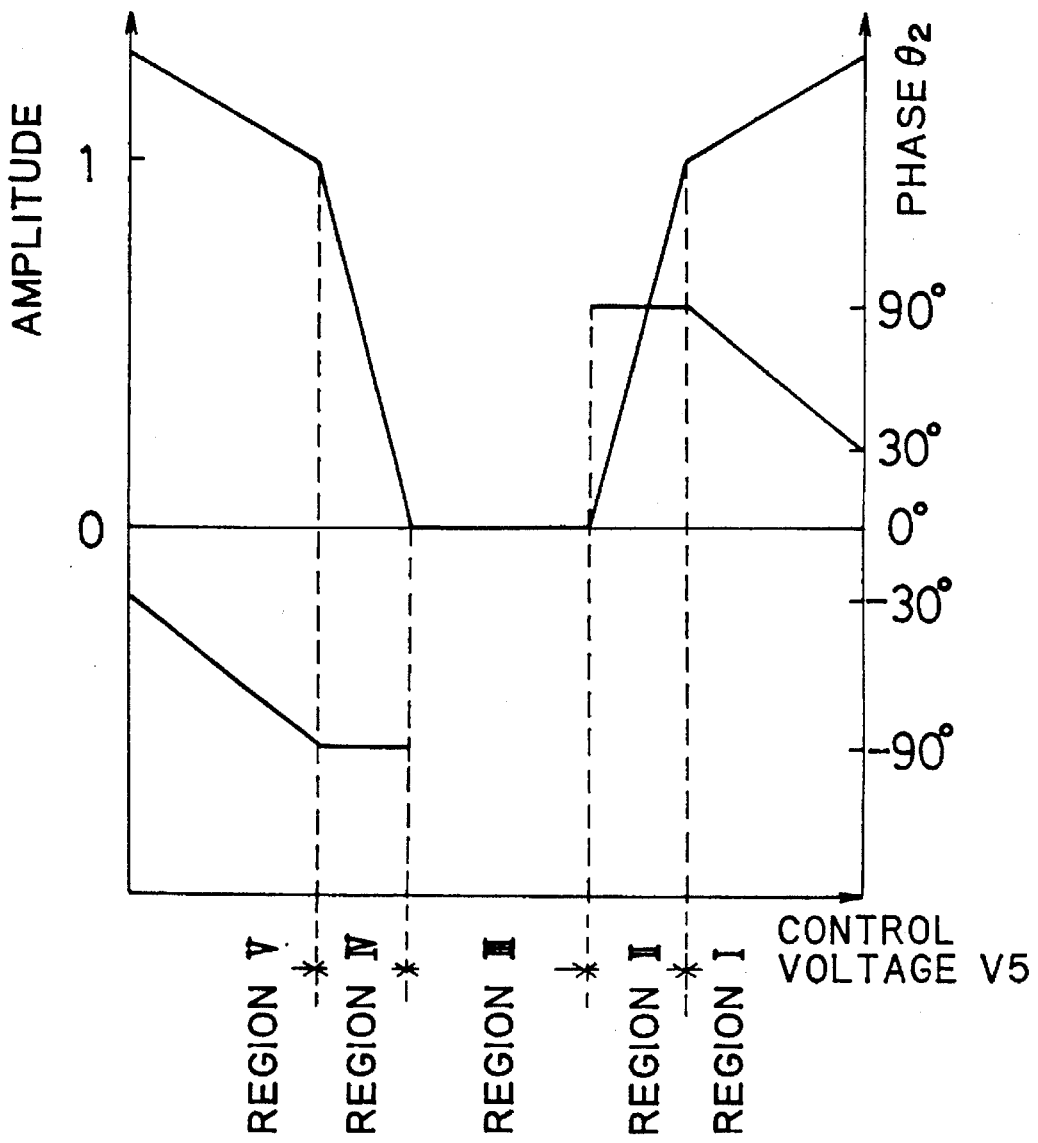
FIG. 8 illustrates an amplitude versus phase characteristic of a vector A.

FIG. 8 illustrates characteristic relation between the amplitude and phase of the vector A.

As shown, the operating region of the VCO 10 has the characteristics in the regions I to V depending upon the control voltage V5. Operation in the respective regions is similar to that of FIG. 22.

FIG. 9 illustrates the characteristic relation, with the region III reduced and represented as a point, for the purpose of illustration.

FIGS. 10A to 10E illustrate relation between the vectors A, B, R in the respective regions.

Figure 10A:
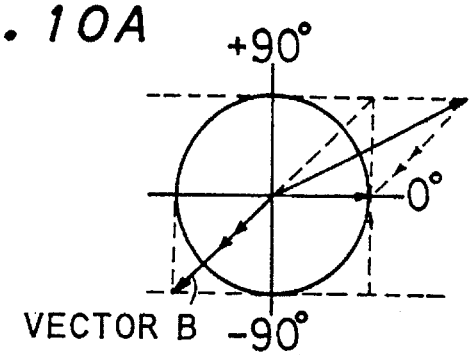
FIGS. 10A, 10B, 10C, 10D, 10E illustrate relation between vectors A, B, R in respective operating regions.

FIG. 10A depicts the region I wherein the vector A is a synthesis of the amplitude with 0° phase and the amplitude with +90° phase. The vector B has a phase which lags the phase of the vector A by 45° or more so as to satisfy the oscillation conditions. The vector B may have a phase which lags the phase of the vector A by 90° or more depending upon the amplitude of the vector A.

Figure 10B:
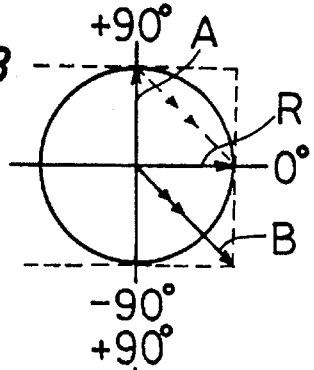
Figure 10C:
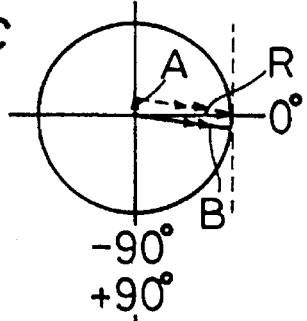

FIGS. 10B and 10C depict the region II wherein the vector A has only the amplitude with +90° phase. The vector B has a phase which lags the phase of the vector A by 45° or less so as to satisfy the oscillation conditions. The phase of the vector B approaches 0° as the amplitude of the vector A decreases.

Figure 10D:
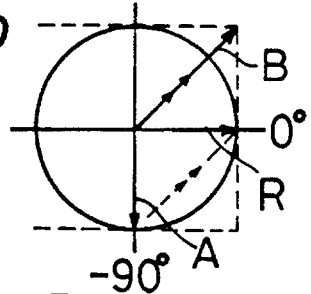

FIG. 10D depicts the region IV wherein the vector A has only the amplitude with −90° phase. The vector B has a phase which leads the phase of the vector A by 45° or less so as to satisfy the oscillation conditions. The phase of the vector B approaches +45° as the amplitude of the vector A increases.

Figure 10E:
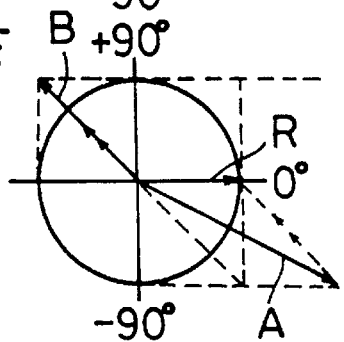

FIG. 10E depicts the region V wherein the vector A is a synthesis of the amplitude with 0° phase and the amplitude with −90° phase. The vector B has a phase which leads the phase of the vector A by 45° or more so as to satisfy the oscillation conditions. The vector B may have a phase which leads the phase of the vector A by 90° or more depending upon the amplitude of the vector A.

Figure 11:
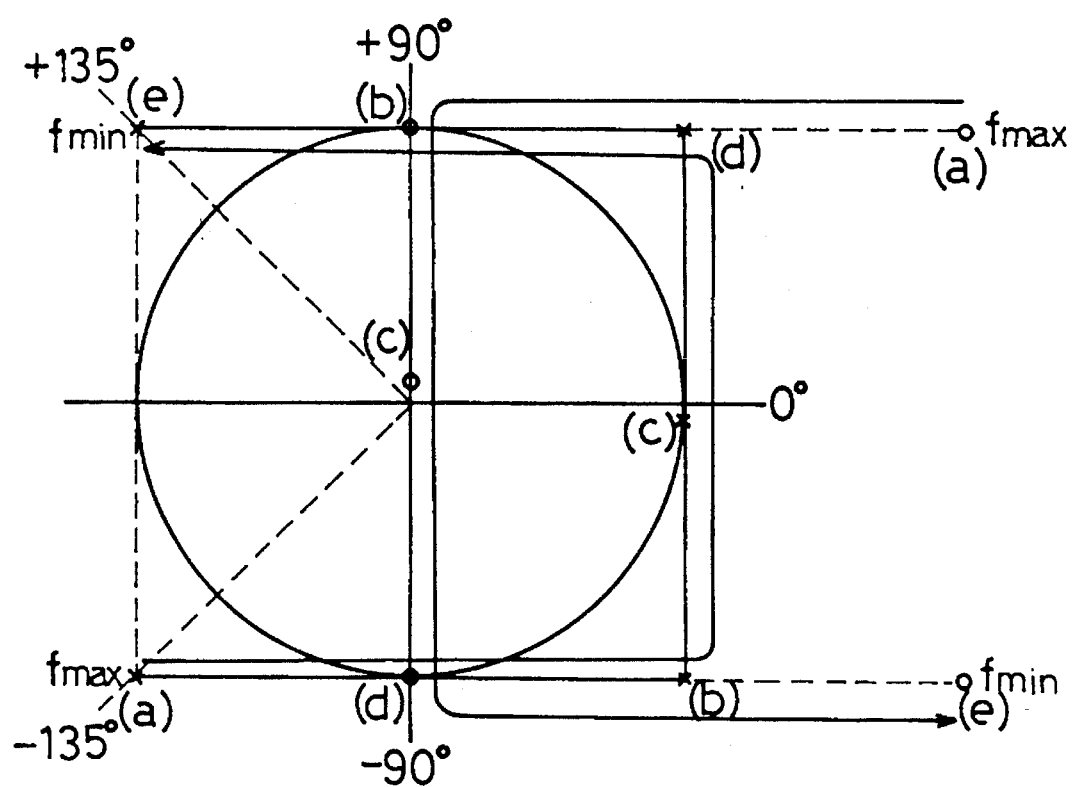
FIG. 11 illustrates the loci of the vectors A and B of FIGS. 10A to 10E.

FIG. 11 illustrates the loci of the vectors A and B of FIG. 10.

As shown, the phase θ1 of the vector B varies from +135° to −135° whereas the phase θ2 of the vector A varies from +90° to −90°.

Figure 12:
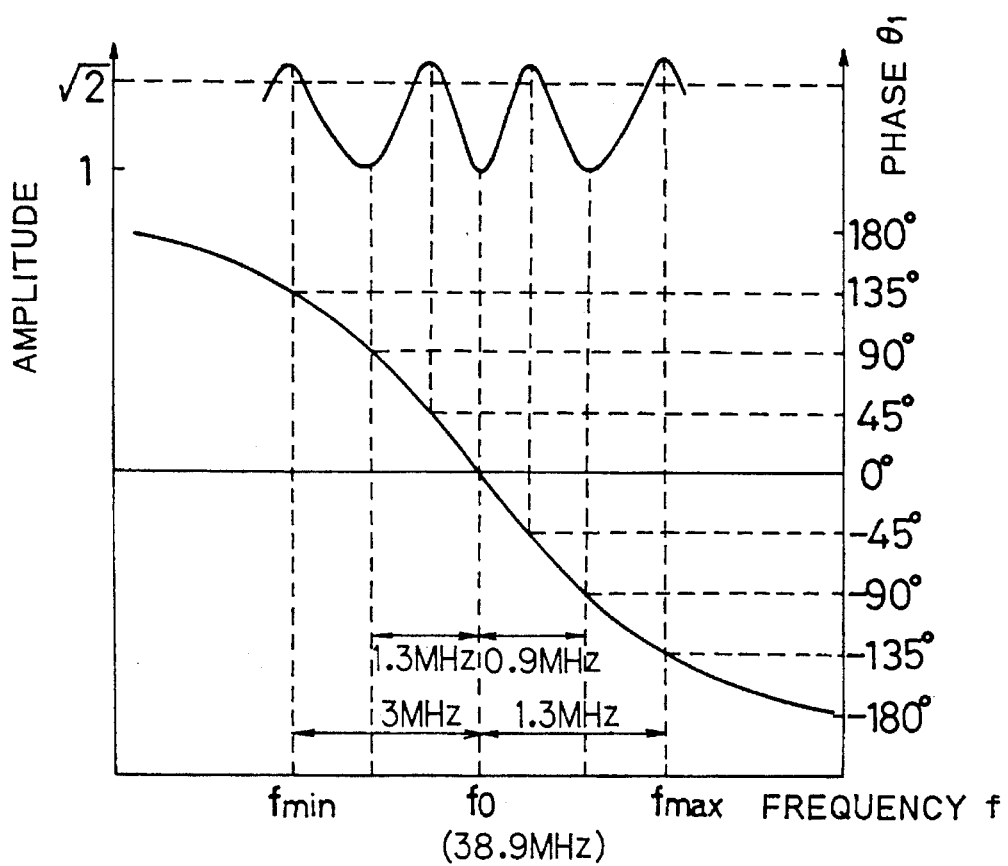
FIG. 12 illustrates an oscillation frequency range of the amplifier 18 of FIG. 1.
Figure 13A:
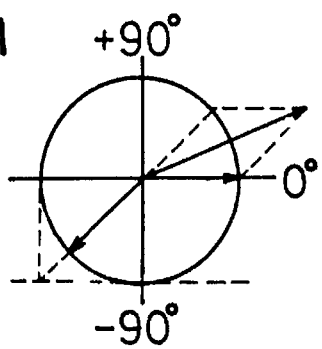
FIGS. 13A, 13B, 13C, 13D, 13E illustrate relation between the vectors A, B, R in the respective operating regions when the locus of the vector A is curved.
Figure 13B:
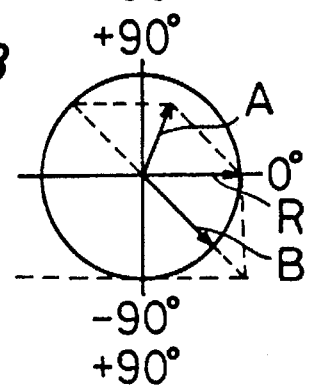
Figure 13C:
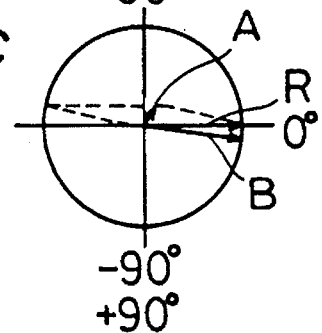
Figure 13D:
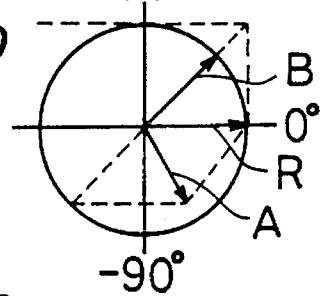
Figure 13E:
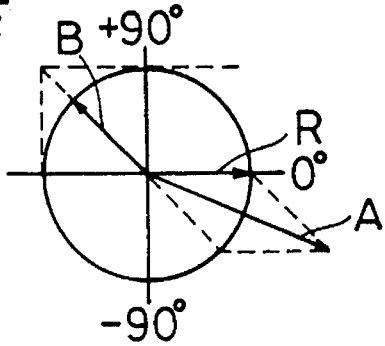
Figure 14:
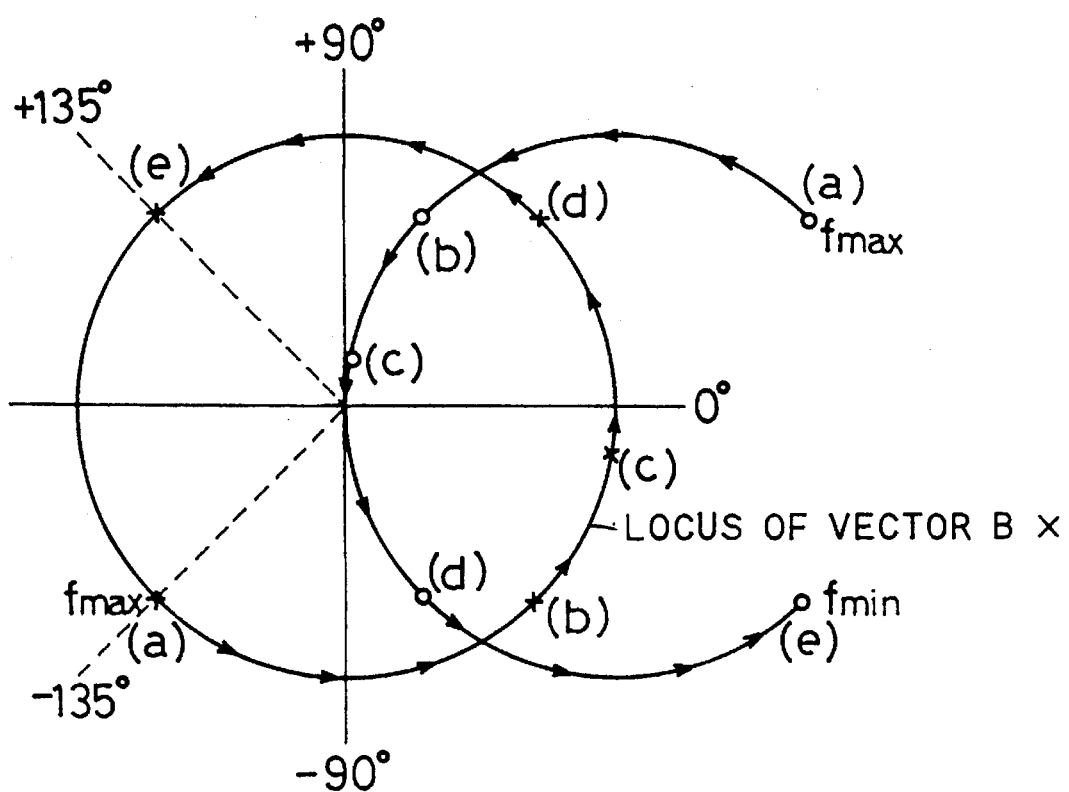
FIG. 14 illustrate the loci of the vectors A and B of FIGS. 13A to 13E.
Figure 20:
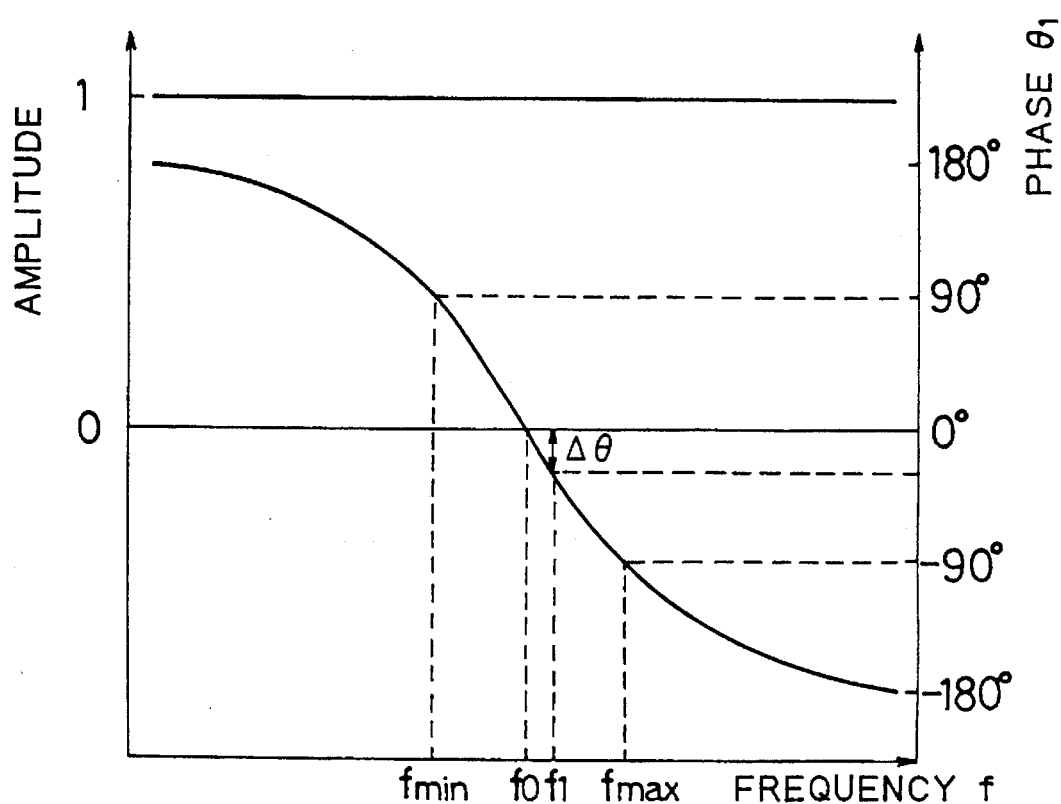
FIG. 20 illustrates an oscillation frequency range of the amplifier 12 shown in FIG. 18.

The +135° to −135° variation of the phase θ1 of the vector B provides a wider variable frequency range from fmax to fmin, that is, a wider capture range as shown in FIG. 12, if an amplifier having the phase-frequency characteristic of FIG. 20 is used, thereby enlarging the lock range of the PLL including the VCO of the present invention. It should be noted that the amplitude of the amplifier 18 is required to be not less than the square root of 2.

Further, if the free-running frequency fo is 38.9 MHz (practically used free-running frequency), the lock range is from +0.9 MHz to −1.3 MHz with respect to the free-running frequency fo when the phase θ1 of the vector B has a variable range of +90°. When the phase θ1 of the vector B has a wider variable range of +135°, the lock range becomes wider, i.e. from +1.3 MHz to −3 MHz.

According to the present invention, setting of the free-running oscillation frequency in the region III inhibits input of the phase and amplitude change signal from the synthesizer 20 to the phase and amplitude changer 15 in the region III, and the free-running frequency output from the amplifier 18 is outputted intactly. Thus, by using a high-accuracy oscillation source such as ceramic resonator and quartz oscillator as the oscillation source 14, the phase characteristic with respect to the frequency of the amplifier is determined accurately. This eliminates the influence of the offset of the phase comparator 2, minimizing variations in free-running oscillation frequency of the PLL.

The conventional semiconductor integrated circuits which are incapable of containing an inductance have encountered difficulty in producing a wide variable phase range of +90° or more in terms of costs and technique. However, this is achieved relatively readily according to the present invention.

Figure 15:
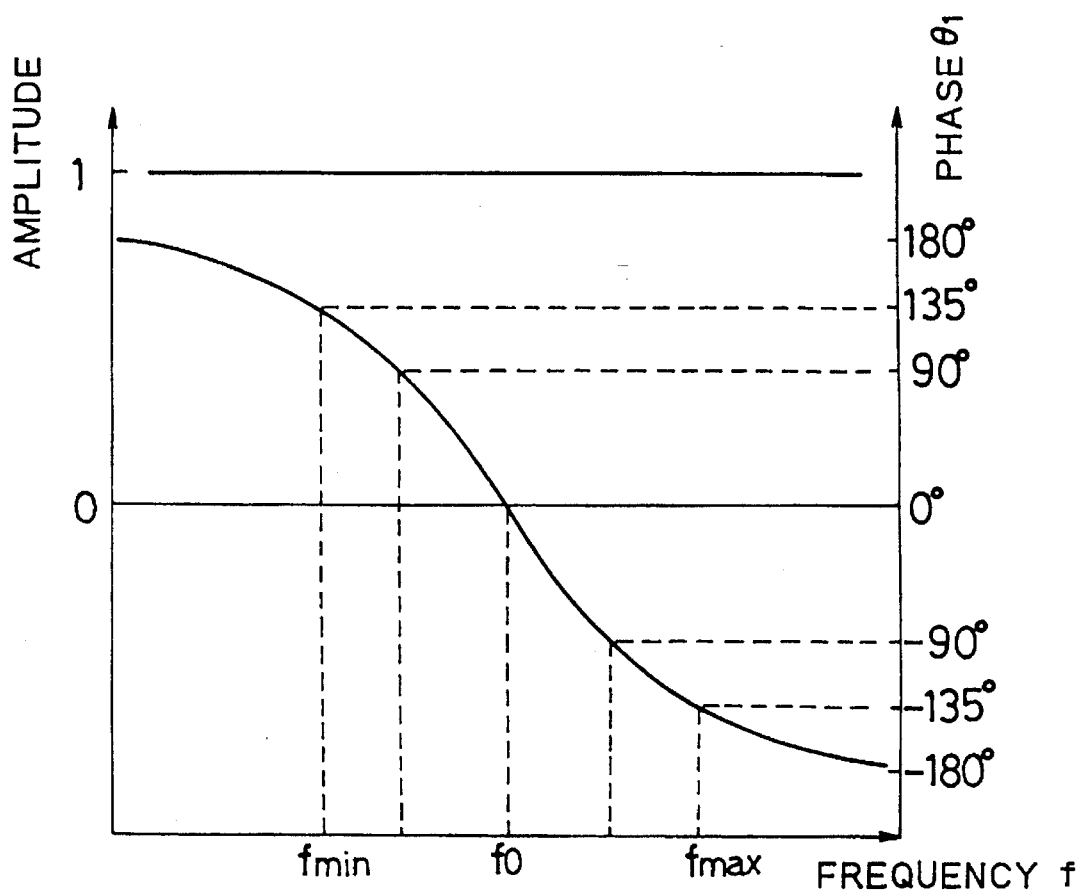
FIG. 15 illustrates an oscillation frequency range of the amplifier of the present invention when the locus of the vector A is curved.

In the foregoing preferred embodiment, the locus of the vector A which is the phase and amplitude change signal of the phase and amplitude changer 15 may be curved as shown in FIGS. 13A to 13E and FIG. 14, thereby providing similar effects as shown in FIG. 15.

Although the output from the synthesizer 20 is applied to one input of the phase comparator 2, the output from the amplifier 18 may be applied thereto.

Figure 16:
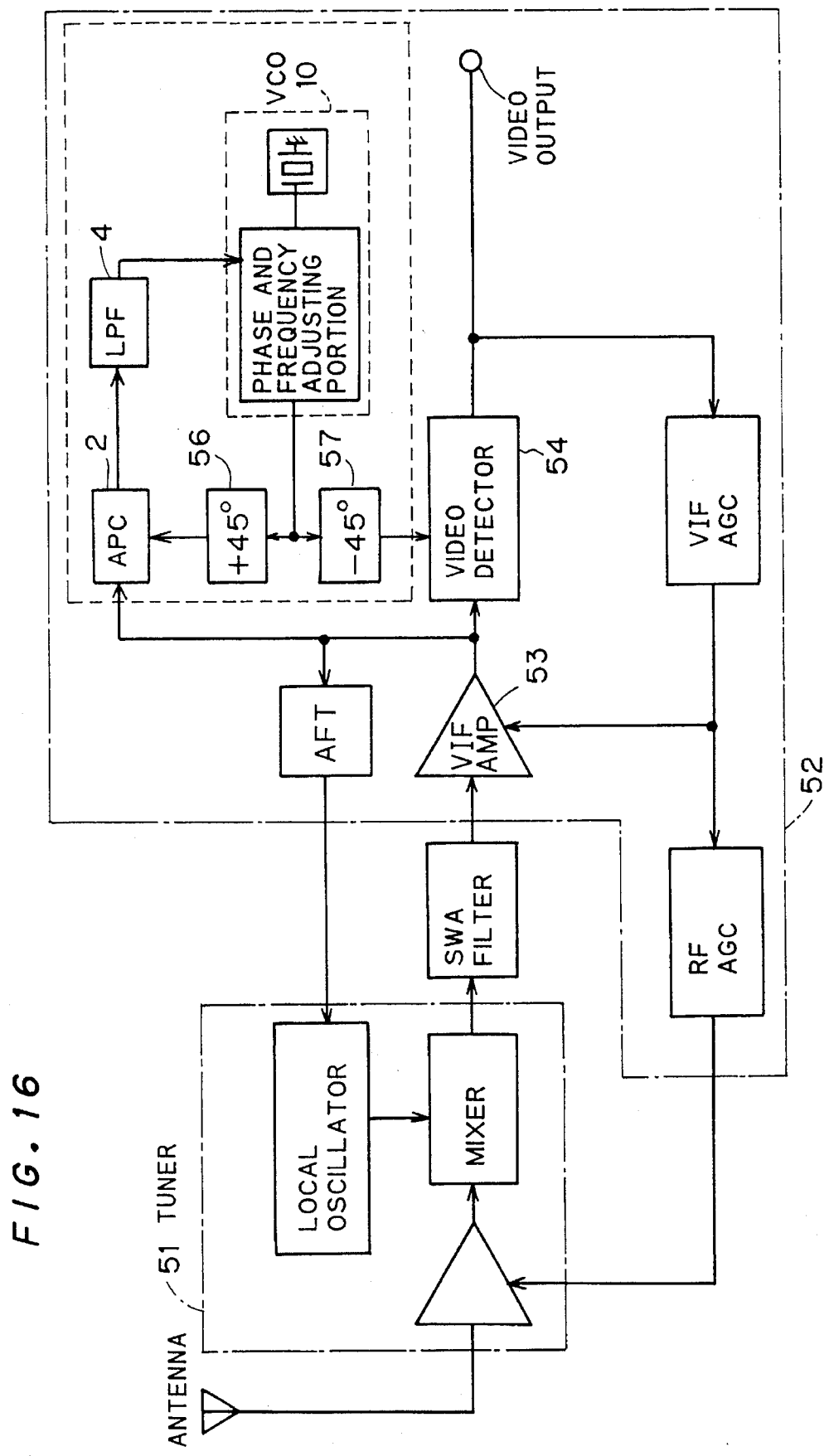
FIG. 16 illustrates an application of the PLL of the present invention.
Figure 17:
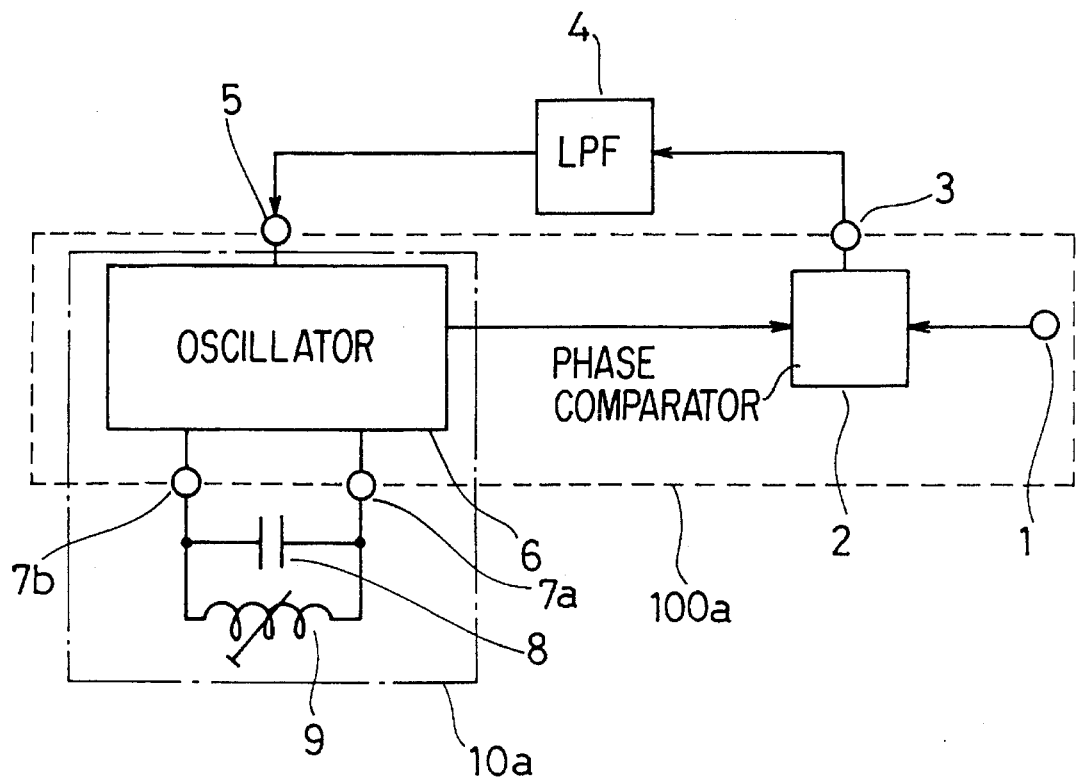
FIG. 17 illustrates a conventional adjustment type PLL.
Figure 18:
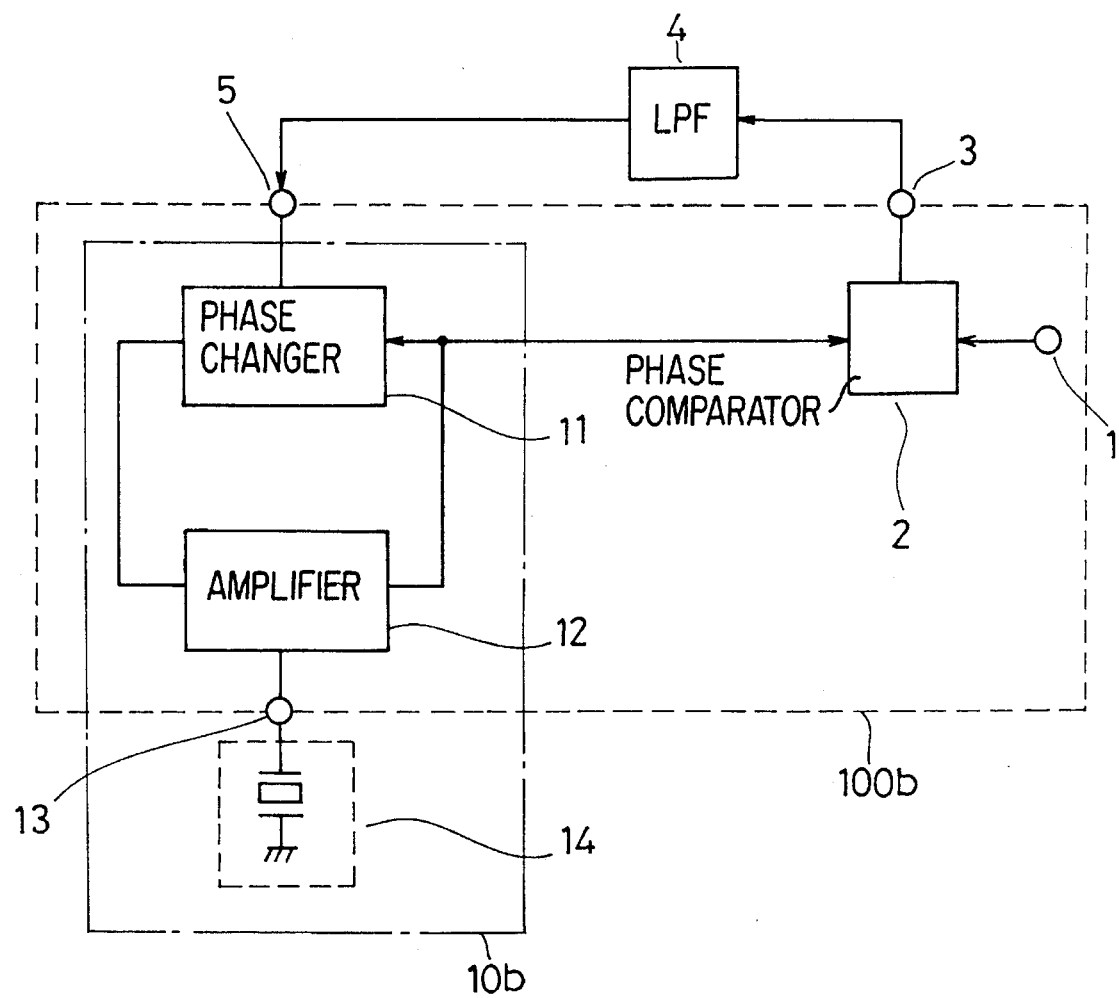
FIG. 18 illustrates a conventional non-adjustment type PLL.
Figure 19:
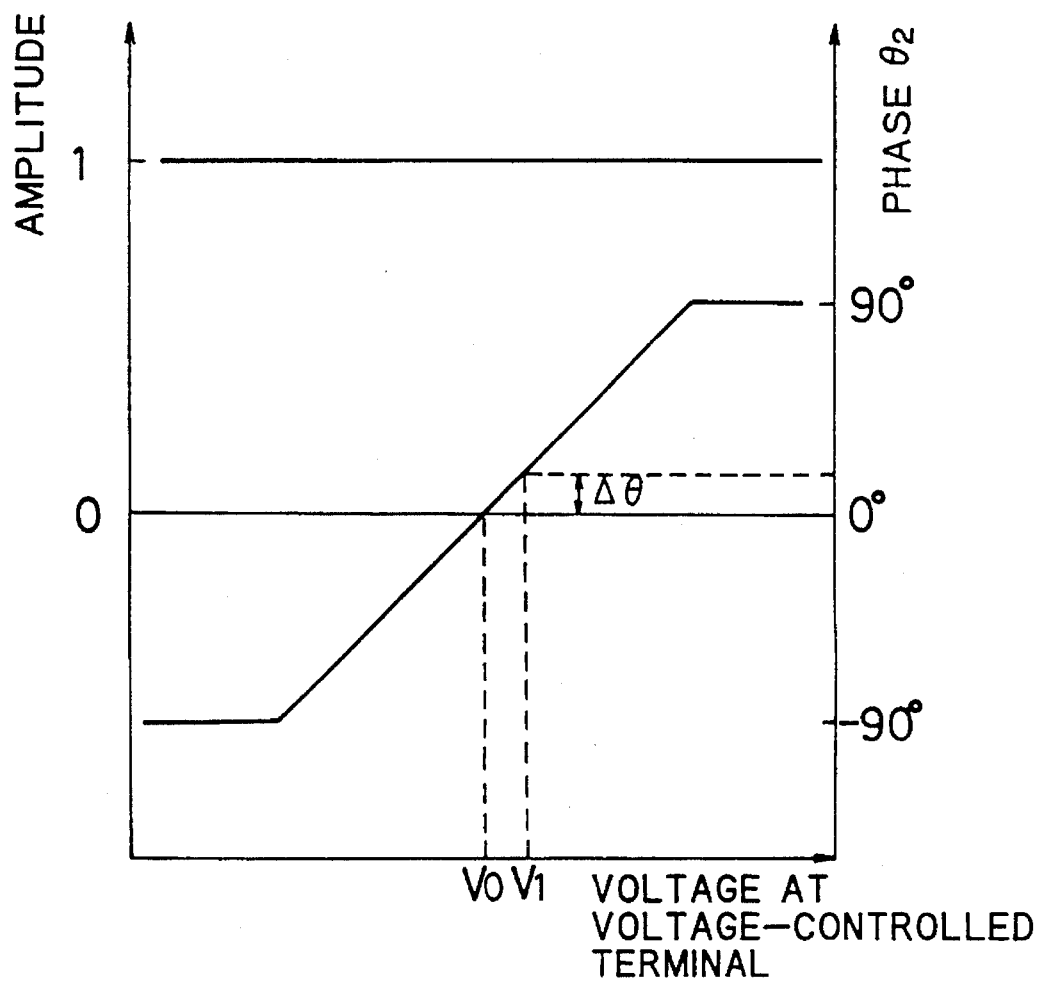
FIG. 19 illustrates characteristics of a phase changer 11 used in FIG. 18.

FIG. 16 illustrates an application of the PLL according to the present invention.

In this application, the PLL is applied to a superheterodyne reception system for use in a radio wave receiver and the like. The superheterodyne reception system is disclosed, for example, in Katsuji Fujita and Tatsuo Tanaka, "Practical Analog Circuit Design for LSI Age," The Nikkan Kogyo Shimbun Ltd.

Referring to FIG. 16, a tuner 51 converts a weak radio wave frequency into an intermediate frequency, which is in turn amplified by an amplifier 53 in a video intermediate frequency (VIF) IC system 52, and video detection is performed by a video detector 54. This is accomplished in such a manner that only a frequency region to be detected is extracted from the signal amplified in the amplifier 53 by using the synchronization maintaining characteristic of a PLL circuit 55 and a detected video signal is outputted.

The PLL circuit 55 includes the APC 2, the LPF 4, the VCO 10 and a phase converter circuit 56 which form a phase-locked loop. The output from the VCO 10 is provided to the video detector 54 through a phase converter circuit 57 which provides output at −45° phase angle and is provided to a first input of the APC 2 through the phase converter circuit 56 which provides output at +45° phase angle.

The APC 2 having a second input receiving the output from the amplifier 53 detects the phase difference between the first and second inputs and then outputs the phase comparison signal to the VCO 10 through the LPF 4 to control the oscillation frequency of the VCO 10. The VCO 10 used herein is similar to that of the preferred embodiment of FIG. 1.

As above described, incorporation of the PLL circuit 55 having the VCO of the present invention into the VIF-IC system 52 provides for non-adjustment of the system and a one-chip system having a wide lock range and a small variation in free-running oscillation frequency of the PLL upon no signal input.

While the invention has been shown and described in detail, the foregoing description is in all aspects illustrative and not restrictive. It is therefore understood that numerous modifications and variations can be devised without departing from the scope of the invention.

What is claimed is:

1. A phase-locked loop device comprising:

a phase comparator which receives an external input signal and an internal control signal and outputs a phase comparison signal representing a phase difference between said external input signal and said internal control signal;

an oscillator which receives said phase comparison signal and outputs said internal control signal, said oscillator including:

(a) a phase and amplitude changer which receives said phase comparison signal and changes the amplitude of said internal control signal in accordance therewith, and which receives said internal control signal and changes the phase thereof in accordance therewith, and which outputs a phase and amplitude change signal;

(b) an amplifier which receives said internal control signal and outputs a phase change signal in accordance with a frequency of said internal control signal; and (c) a synthesizer which receives said phase and amplitude change signal output from said phase and amplitude changer and said phase change signal output from said amplifier and outputs said internal control signal to said phase and amplitude changer, said amplifier, and said phase comparator.

2. The phase-locked loop device of claim 1, wherein an amplitude of said phase and amplitude change signal is set to not less than an amplitude of said phase change signal, a variable phase range of said phase change signal being wider than a variable phase range of said phase and amplitude change signal.

3. The phase-locked loop device of claim 2, wherein said amplifier includes an oscillation source for oscillating at a predetermined oscillation frequency and serving as a reference of the oscillation frequency of said phase change signal, and a reactance element for preventing said oscillation source from oscillating at a frequency outside a desired frequency region.

4. The phase-locked loop device of claim 3, wherein said reactance element is a capacitor.

5. The phase-locked device of claim 3, further comprising:

a low-pass filter, connected between said phase comparator and said oscillator, which receives said phase comparison signal and removes a high frequency component superimposed thereon and outputs an output signal to said oscillating portion.

6. The phase-locked loop device of claim 5, wherein said phase comparator and said oscillator, except said oscillation source, are integrated.

7. An oscillator comprising:

a phase and amplitude changer which receives an external control signal and changes the amplitude of an internal control signal in accordance therewith, and which receives said internal control signal and changes the phase thereof in accordance therewith, and which outputs a phase and amplitude change signal;

an amplifier which receives said internal control signal and outputs a phase change signal in accordance with a frequency of said internal control signal; and a synthesizer which receives said phase and amplitude change signal output from said phase amplitude changer and said phase change signal output from said amplifier and outputs said internal control signal to said phase and amplitude changer and said amplifier, wherein an amplitude of said phase and amplitude change signal is set to not less than an amplitude of said phase change signal, a variable phase range of said phase change signal being wider than a variable phase range of said phase and amplitude change signal.

8. A signal processor comprising:

a signal detector which receives an external input signal and an internal control signal and which detects said external input signal and outputs a detection signal in response to said internal control signal;

a phase comparator which receives said external input signal and said internal control signal and outputs a phase comparison signal representing a phase difference between said external input signal and said internal control signal;

an oscillator which receives said phase comparison signal and outputs said internal control signal, said oscillator including:

(a) a phase and amplitude changer which receives said phase comparison signal and changes the amplitude of said internal control signal in accordance therewith, and which receives said internal control signal and changes the phase thereof in accordance therewith, and which outputs a phase and amplitude change signal;

(b) an amplifier which receives said internal control signal and outputs a phase change signal in accordance with a frequency of said internal control signal; and (c) a synthesizer which receives said phase and amplitude change signal output from said phase and amplitude changer and said phase change signal output from said amplifier and outputs said internal control signal to said phase and amplitude changer, said amplifier, and said phase comparator.

9. The signal processor of claim 8, wherein an amplitude of said phase and amplitude change signal is set to not less than an amplitude of said phase change signal, a variable phase range of said phase signal being wider than a variable phase range of said phase and amplifier change signal.

10. The signal processor of claim 9, wherein said external input signal is a video intermediate frequency signal received in a superheterodyne reception system.

* * * * *